US012601766B2

(12) United States Patent
Slivnik

(10) Patent No.: US 12,601,766 B2
(45) Date of Patent: Apr. 14, 2026

(54) APPARATUS FOR MEASURE OF QUANTITY AND ASSOCIATED METHOD OF MANUFACTURING

(71) Applicant: HALL ELEMENT DEVICES (IP HOLDINGS) LIMITED, Victoria Mahe (SC)

(72) Inventor: Tomaz Slivnik, Sark (GB)

(73) Assignee: Tomaz Slivnik, Sark (GB)

( * ) Notice: Subject to any disclaimer, the term of this patent is extended or adjusted under 35 U.S.C. 154(b) by 278 days.

(21) Appl. No.: 18/211,109

(22) Filed: Jun. 16, 2023

(65) Prior Publication Data

US 2023/0333145 A1    Oct. 19, 2023

Related U.S. Application Data

(63) Continuation of application No. 17/731,978, filed on Apr. 28, 2022, now Pat. No. 11,719,725, which is a (Continued)

(30) Foreign Application Priority Data

| Dec. 19, 2014 | (GB) | ..................................... | 1422834 |
| Jul. 23, 2015 | (GB) | ..................................... | 1513034 |
| Jul. 24, 2015 | (GB) | ..................................... | 1513084 |

(51) Int. Cl.
   *G01R 33/09* (2006.01)
   *G01R 15/20* (2006.01)
   (Continued)

(52) U.S. Cl.
   CPC ........... *G01R 15/205* (2013.01); *G01R 15/20* (2013.01); *G01R 19/00* (2013.01); *G01R 21/00* (2013.01);
   (Continued)

(58) Field of Classification Search
   CPC  G01R 33/0206; G01R 33/028; G01R 33/038; G01R 33/1215
   See application file for complete search history.

(56) References Cited

U.S. PATENT DOCUMENTS

| 6,373,150 | B1 * | 4/2002 | Fuller | ....................... | H02J 3/14 |
| | | | | | 307/39 |
| 7,075,287 | B1 * | 7/2006 | Mangtani | ................ | H01L 24/37 |
| | | | | | 324/117 H |
| 2008/0227235 | A1 * | 9/2008 | Theuss | .................. | G01L 19/086 |
| | | | | | 438/53 |

* cited by examiner

*Primary Examiner* — Tung X Nguyen
(74) *Attorney, Agent, or Firm* — Fresh IP PLC; Clifford D. Hyra; Aubrey Y. Chen

(57)    ABSTRACT

An integrated device provides a measure of a quantity dependent on current through an electrical conductor, having: a sensing and processing sub-system: an electrical conductor conducting current: an insulating material encapsulates the sensing and processing sub-system and maintains the electrical conductor in a fixed and spaced relationship to the sensing and processing sub-system. The insulating material insulates the electrical conductor from the sensing and processing sub-system. Sensing and processing sub-system sensing circuitry includes magnetic field sensing elements adjacent the electrical conductor. The sensing circuitry provides a measure of the quantity as a weighted sum and/or difference of magnetic field sensing elements outputs caused by current through the electrical conductor adjacent the magnetic field sensing elements. A voltage sensing input senses a measure of voltage associated with the current conductor. Sensing and processing sub-system output circuitry provides an output measure of the quantity from the sensed measure of current and voltage.

21 Claims, 35 Drawing Sheets

10 mm

Related U.S. Application Data continuation of application No. 17/031,960, filed on Sep. 25, 2020, now Pat. No. 11,353,482, which is a continuation of application No. 15/537,770, filed as application No. PCT/GB2015/054090 on Dec. 18, 2015, now Pat. No. 10,830,797.

(51) Int. Cl.

| | |
|---|---|
| *G01R 19/00* | (2006.01) |
| *G01R 21/00* | (2006.01) |
| *G01R 21/08* | (2006.01) |
| *G01R 22/06* | (2006.01) |
| *G01R 33/07* | (2006.01) |

(52) U.S. Cl.

CPC ........... *G01R 21/006* (2013.01); *G01R 21/08* (2013.01); *G01R 22/06* (2013.01); *G01R 33/07* (2013.01); *G01R 33/09* (2013.01); *H01L 2224/05554* (2013.01); *H01L 2224/48195* (2013.01); *H01L 2224/48247* (2013.01); *H01L 2224/49113* (2013.01); *H01L 2924/19105* (2013.01)

10

VIN
114

120

112

124

SLEEP | I/O$_1$

IRQ | I/O$_2$

SCLK | I/O$_3$

MOSI | I/O$_4$

SS | I/O$_5$

MISO | I/O$_6$

POUT$_i$ | I/O$_7$

AOUT$_i$ | I/O$_8$

TOUT$_i$ | I/O$_9$

PWMOUT$_i$ | I/O$_{10}$

DIR | I/O$_{11}$

CREEP | I/O$_{12}$

CPOUT$_i$ | I/O$_{13}$

CNOUT$_i$ | I/O$_{14}$

TSEL | I/O$_{15}$

SEL | I/O$_{16}$

COMM | I/O$_{17}$

119

117

I/O$_{18}$ | PROG

116

RREF

123

118

VDD

VSS

115

111

11

113

113

113

112

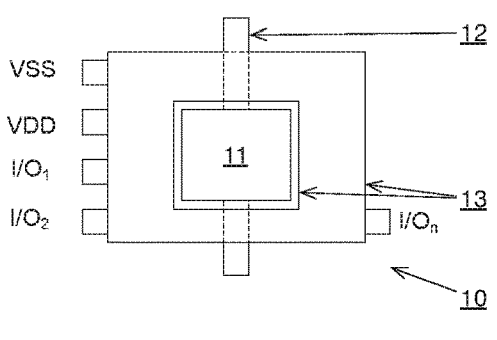
*Fig. 7*
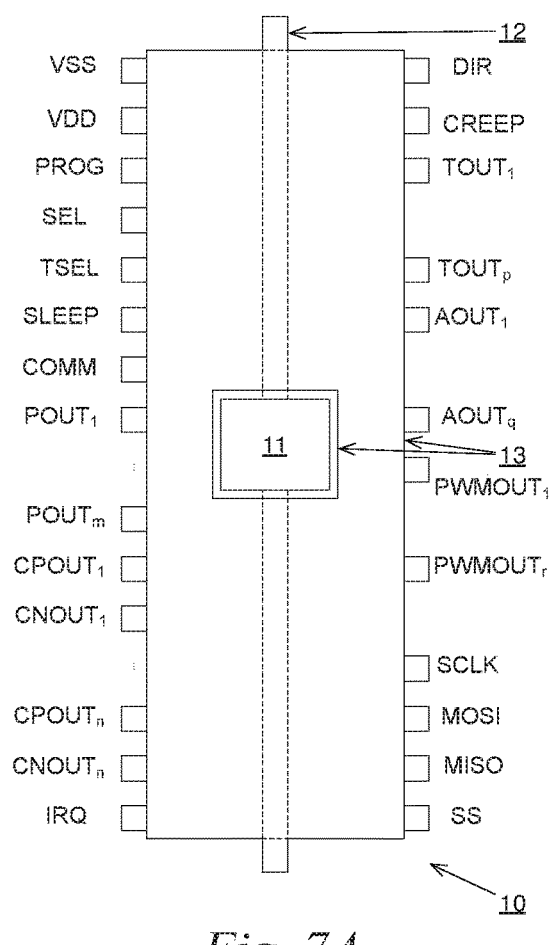
*Fig. 7A*
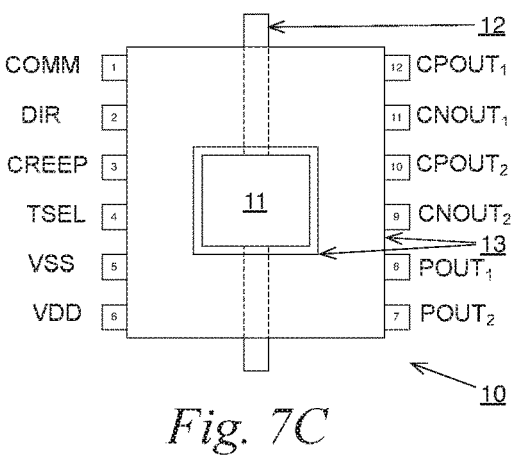
*Fig. 7B*
*Fig. 7C*
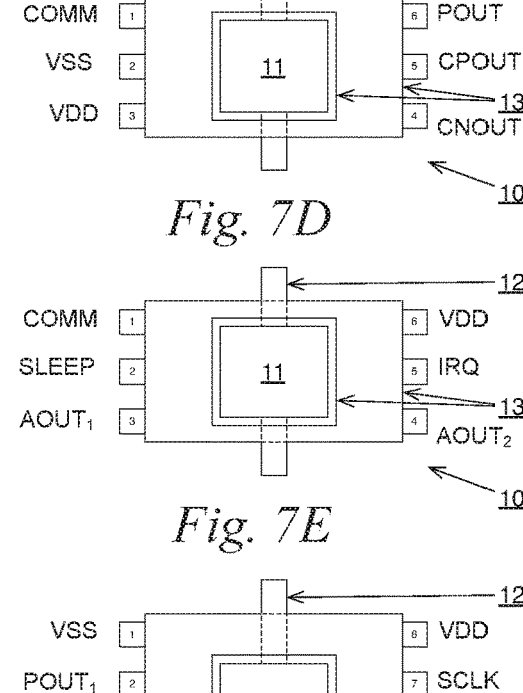
*Fig. 7D*
*Fig. 7E*
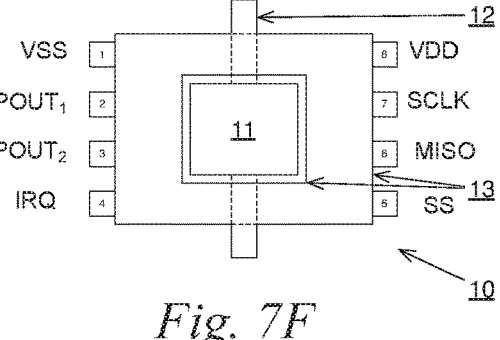
*Fig. 7F*

(a)  (b)  (c)

(a)  (b)  (c)

APPARATUS FOR MEASURE OF QUANTITY AND ASSOCIATED METHOD OF MANUFACTURING

The present disclosure relates to measuring devices and related methods, more particularly to integrated devices, still more particularly to integrated devices for providing a measure of quantities dependent on the current through a conductor, such as the active and reactive power.

Devices for power measurement are known in the art. Conventionally, the use of a separate current and a separate voltage sensor and a separate processing device is required. In some known examples, the current sensor may be a shunt resistor, a current transformer, a Rogowski coil or a discrete Hall element. Traditionally, the output of each of the current and voltage analog sensors must be passed through an Analog-to-Digital converter and transferred to a micropro-cessor, microcontroller, digital signal processor or similar device which multiplies the two digital measures, and numerically integrates them.

The known devices have drawbacks. They are generally bulky and consume a lot of space. This makes power measurement infeasible in situations where space is scarce, as e.g, in the socket of a smart light bulb, in a smart plug, in a smart socket, or in other miniaturized devices.

A large number of external components is generally required in the known devices. These must be assembled, and the final module assembly must be tested and calibrated. As well as consuming space, this is costly and time con-suming. This makes power measurement infeasible where cost is an issue, e.g, in high volume low cost consumer devices.

The metrology knowledge required to get the known devices to work accurately is difficult and requires specific domain expertise. There may be a phase shift between the readings of the voltage and the current sensors, quantisation errors, offsets and temperature dependence, which either result in poor metrology or must be carefully compensated for. This makes power measurement infeasible where spe-cialist domain expertise is either not available or available only on prohibitive terms relative to the primary require-ments of the application.

The known devices, discrete Hall elements, current trans-formers and Rogowski coils particularly, are vulnerable to interference from stray electromagnetic fields, and must be shielded. Furthermore, discrete Hall elements may suffer from noise and require a field concentrator to improve the signal-to-noise ratio. This is costly and space consuming.

While the method of differential field sensing by the use of two sensors is known (at least in the context of current measurement) to the person skilled in the art and offers partial rejection of stray electromagnetic fields without shielding, this method works only for rejection of stray electromagnetic fields which are spatially constant (as well as, when external discrete current sensors are used, adding to cost and space usage). In particular, the method does not work well for certain common stray electromagnetic fields such as high frequency electromagnetic fields and electro-magnetic fields generated by nearby current conductors. In particular, the method does not work sufficiently well (with-out shielding) to meet metering standards mandated of domestic and industrial meters by certain national standards bodies (such as ANSI and IEC).

Shunt resistor sensors give a current reading which is live, so the customer-facing electronics must be isolated from the energy sensing part with optocouplers or other isolators. Likewise, use of shunt resistor current sensors in polyphase energy measurement requires isolation of readings from the different phases with isolators of the same kind.

Aspects, embodiments and examples of the disclosure are defined in the appended claims.

Aspects and embodiments of the disclosure are also described, by way of non-limiting example only, with ref-erence to the accompanying drawings, in which;

FIG. 7 shows a schematic representation of a device comprising the part in FIG. 4 encapsulated as a chip in an integrated circuit package with an integrated conductor, as per FIG. 1;

FIG. 7A shows a schematic representation of a device comprising the part in FIG. 4A encapsulated as a chip in an integrated circuit package with an integrated conductor, as per FIG. 1;

FIG. 7B shows a schematic representation of a device comprising the part in FIG. 4B encapsulated as a chip in a 4-pin integrated circuit package with an integrated conduc-tor, as per FIG. 1;

FIG. 7C shows a schematic representation of a device comprising the part in FIG. 4C encapsulated as a chip in a 12-pin integrated circuit package with an integrated conductor, as per FIG. 1;

FIG. 7D shows a schematic representation of a device comprising the part in FIG. 4D encapsulated as a chip in a 6-pin integrated circuit package with an integrated conductor, as per FIG. 1;

FIG. 7E shows a schematic representation of a device comprising the part in FIG. 4E encapsulated as a chip in a 6-pin integrated circuit package with an integrated conductor, as per FIG. 1;

FIG. 7F shows a schematic representation of a device comprising the part in FIG. 4F encapsulated as a chip in an 8-pin integrated circuit package with an integrated conductor, as per FIG. 1;

Figures 4, 4A, 4B, 4C, 4D, 4E:
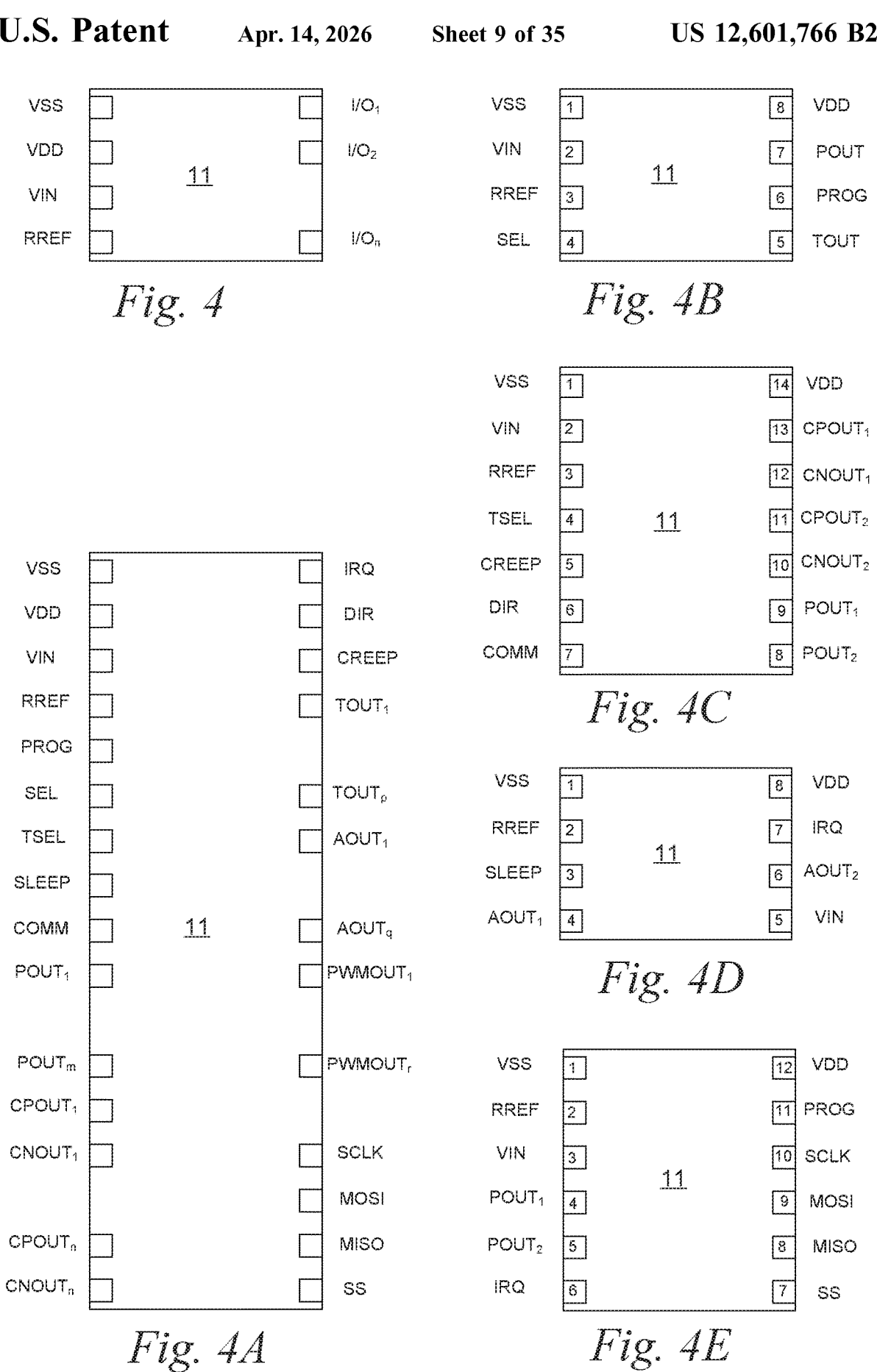
FIG. 4 shows a schematic representation of an example part of a power measurement device.
FIG. 4A shows a schematic representation of the part of a power measurement device in FIG. 4 with a more specific assignment of the input-outputs.
FIGS. 4B to 4E show schematic representations of the part of a power measurement device in FIG. 4A with only some input-outputs implemented.
Figures 6, 6A, 6B, 6C, 6D, 6E, 6F:
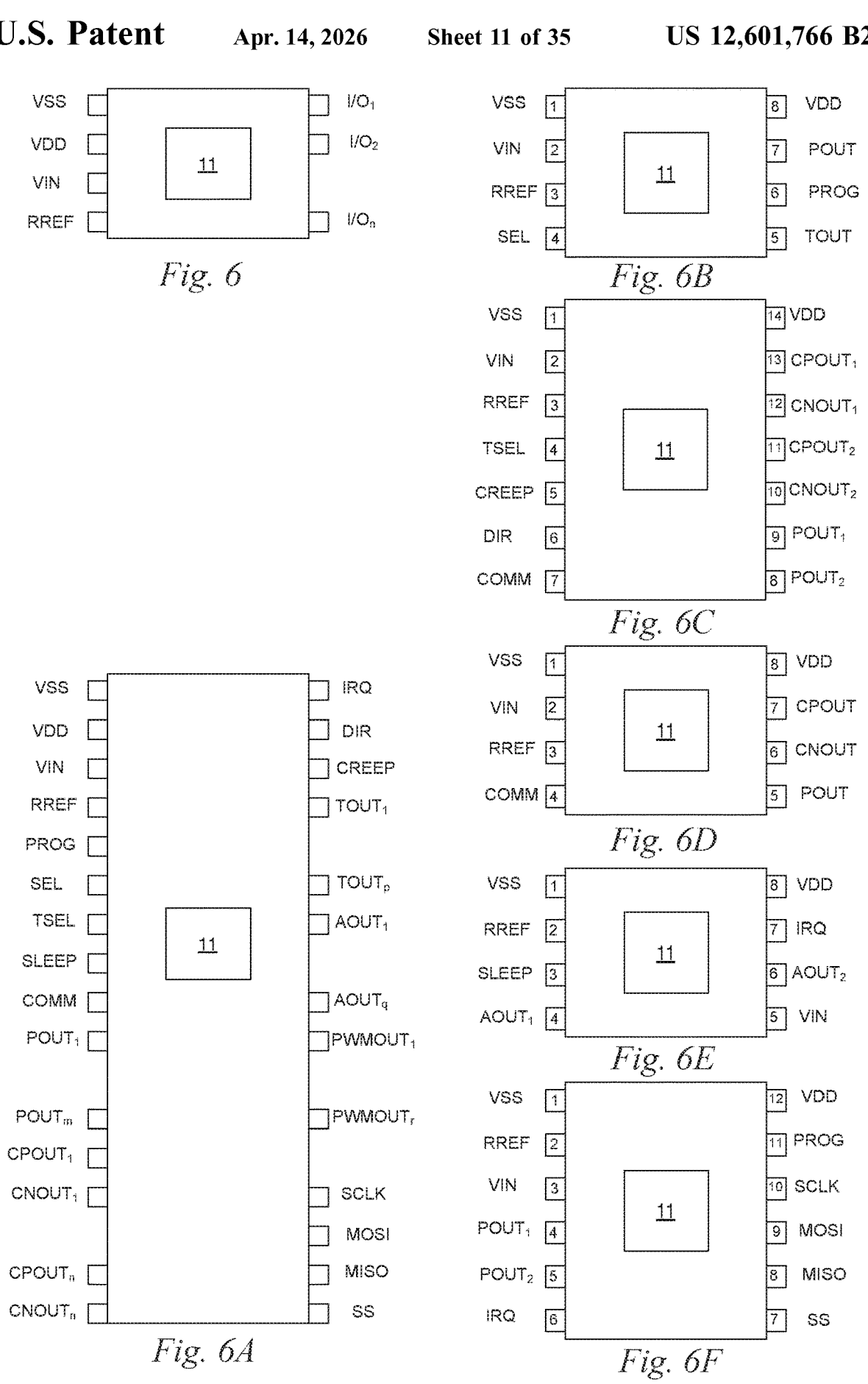
FIG. 6 shows a schematic representation of the part in FIG. 4 encapsulated as a chip in an integrated circuit package.
FIG. 6A shows a schematic representation of the part in FIG. 4A encapsulated as a chip in an integrated circuit package.
FIG. 6B shows a schematic representation of the part in FIG. 4B encapsulated as a chip in an 8-pin integrated circuit package.
FIGS. 6C and 6D show schematic representations of the part in FIG. 4C encapsulated as a chip in a 14-pin and an 8-pin integrated circuit package, respectively.
FIG. 6E shows a schematic representation of the part in FIG. 4D encapsulated as a chip in an 8-pin integrated circuit package.
FIG. 6F shows a schematic representation of the part in FIG. 4E encapsulated as a chip in a 12-pin integrated circuit package.
Figure 8:
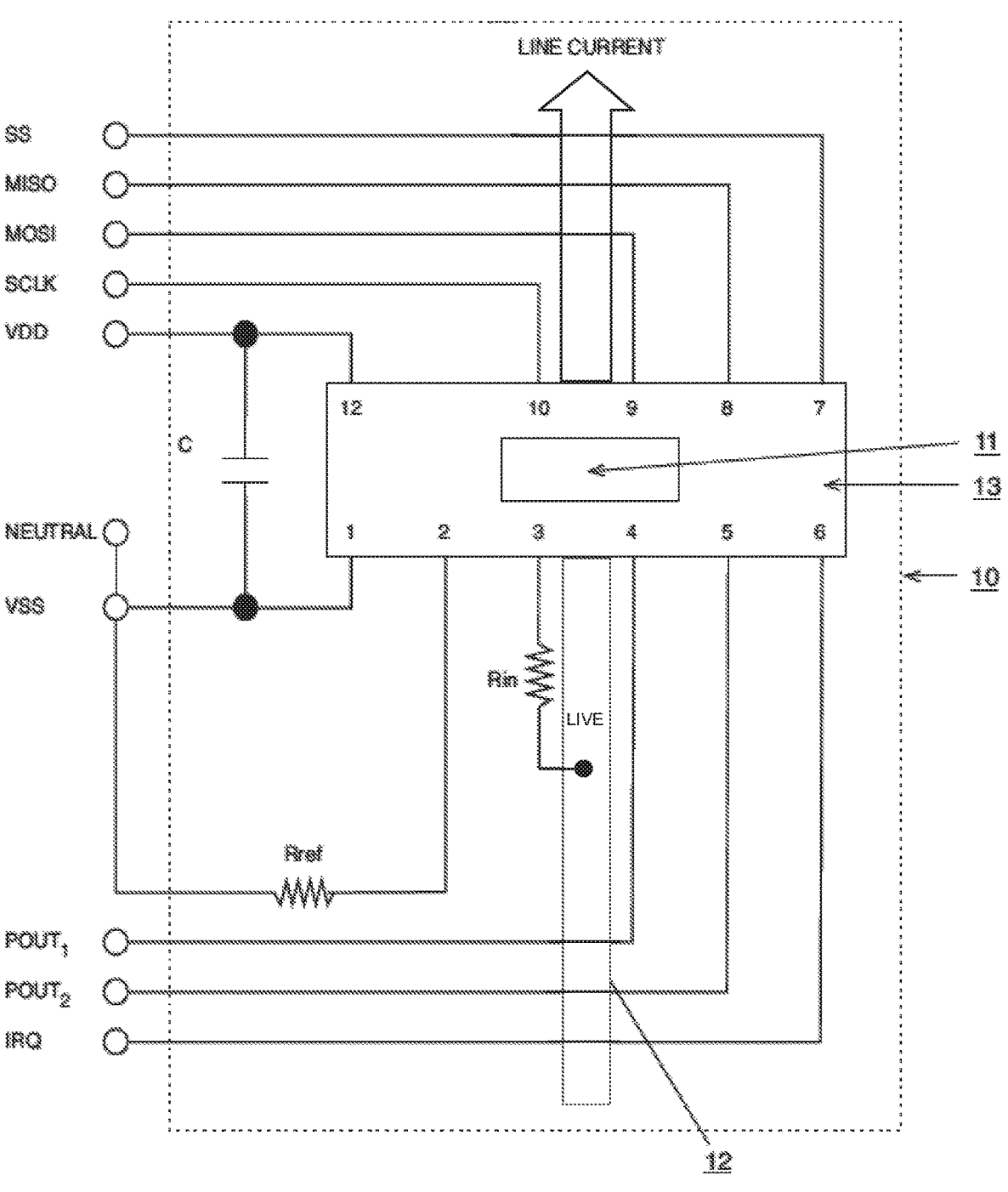
FIG. 8 shows a schematic representation of a power measurement device as in FIGS. 2 to 2C comprising the part in FIG. 4E or the encapsulated part in FIG. 6F.
Figure 9A:
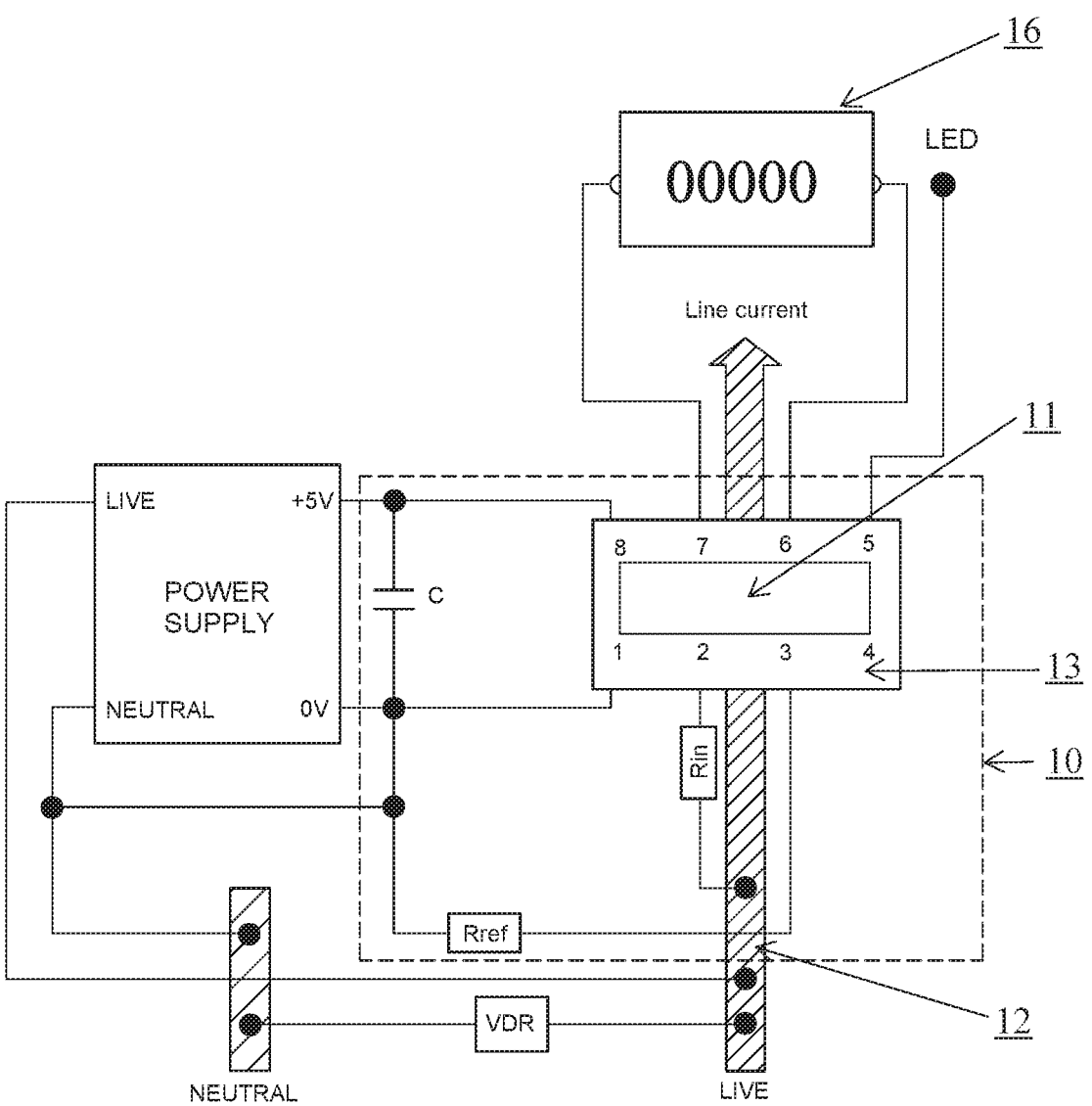
Figure 9B:
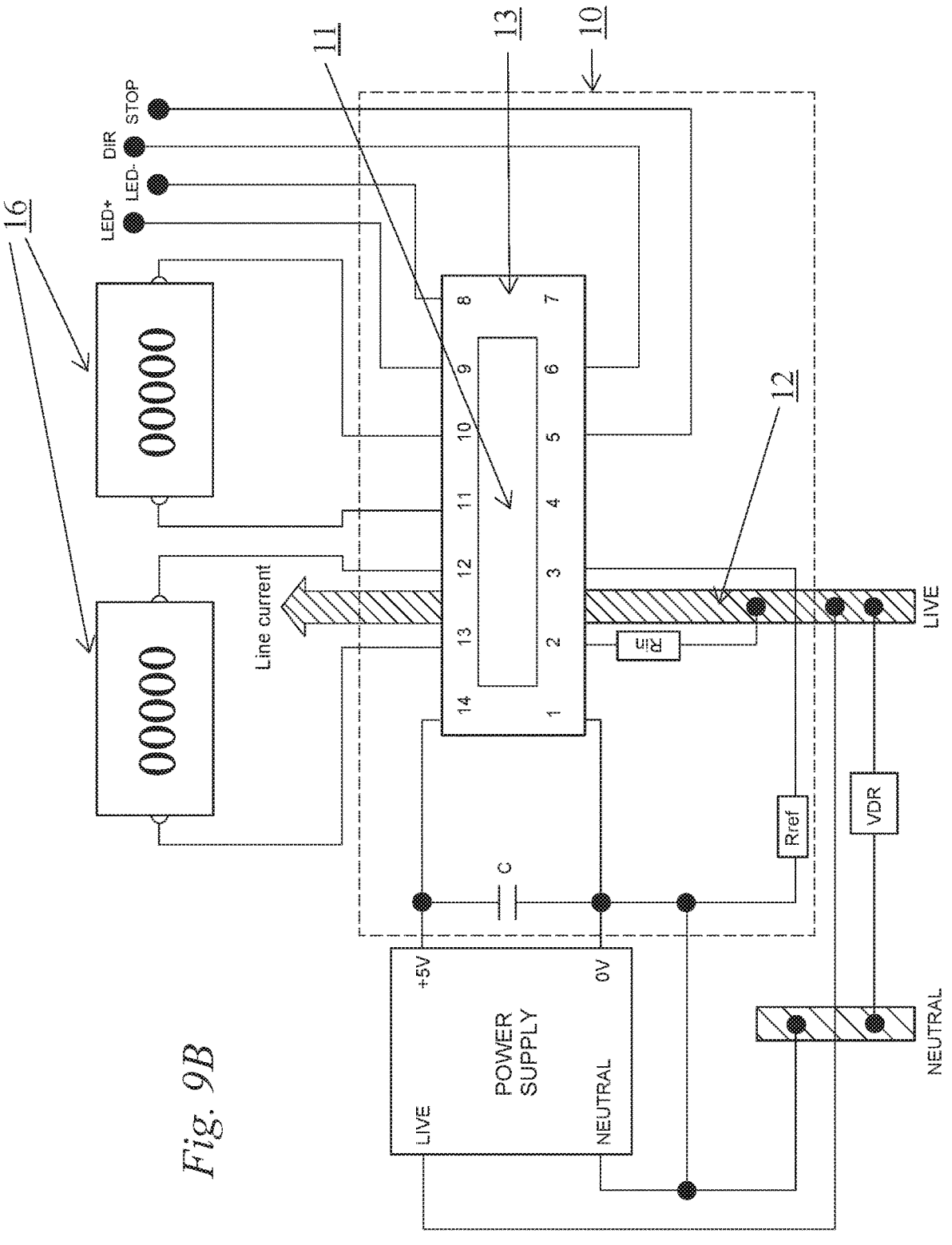
Figure 9C:
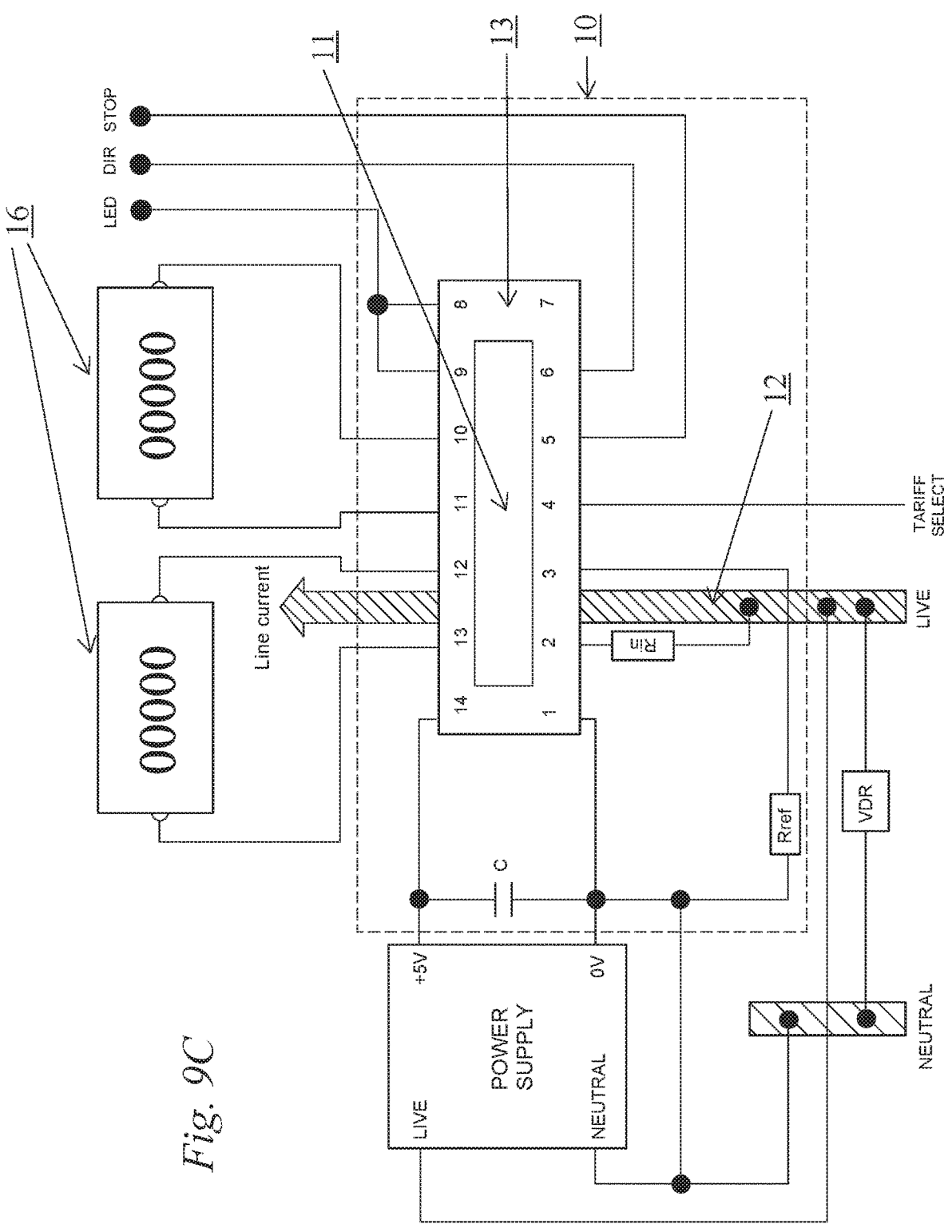
Figure 9D:
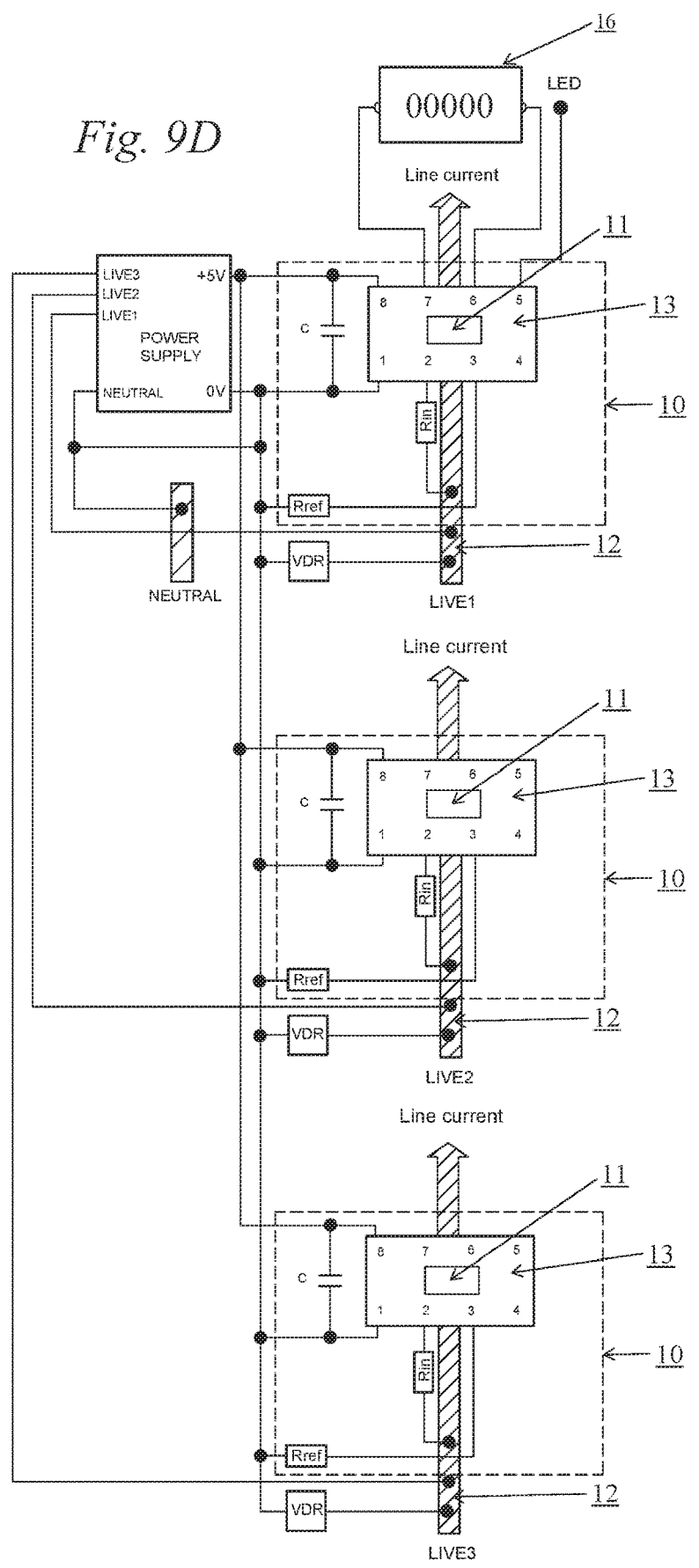
Figure 9E:
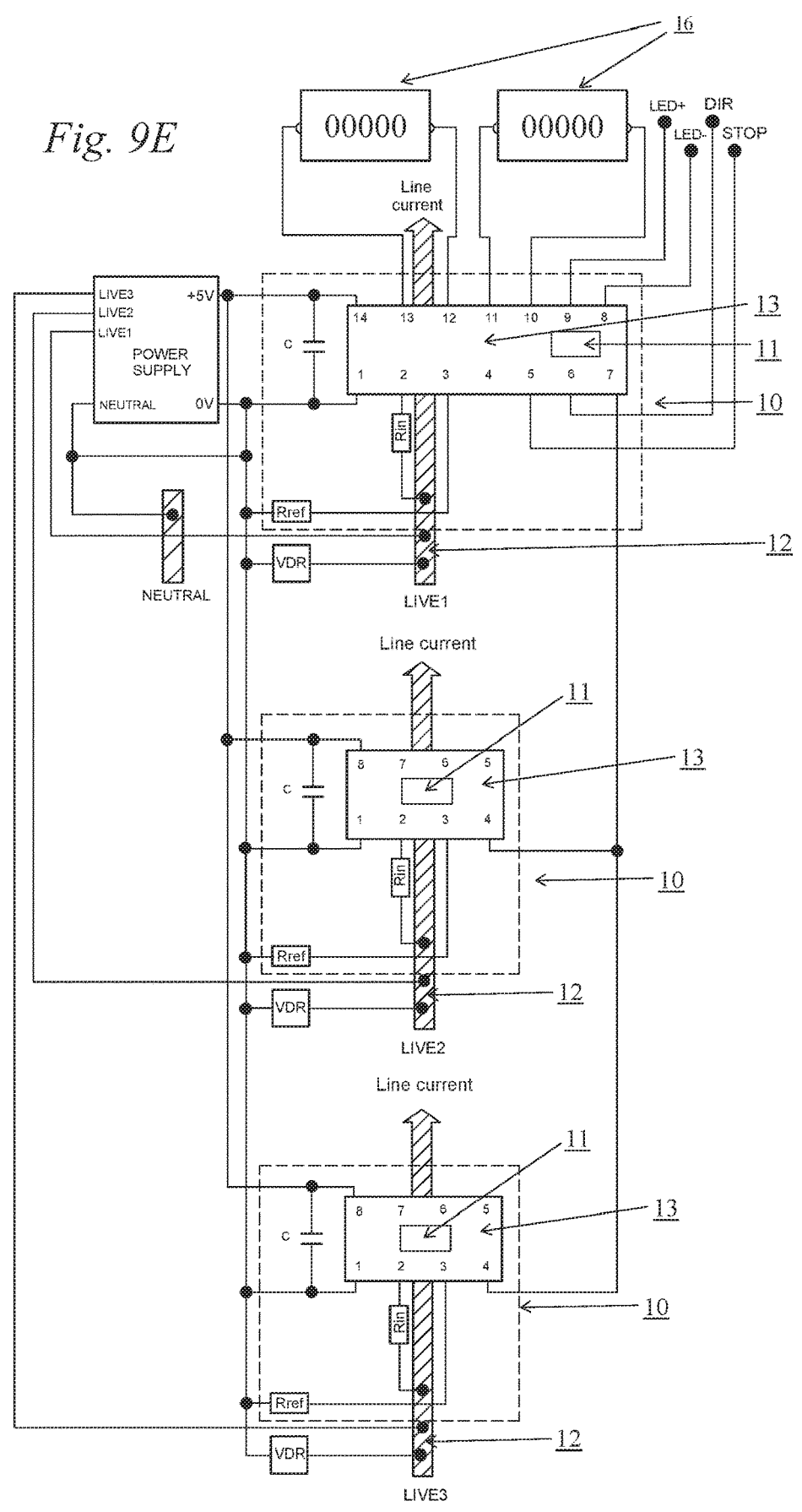
Figure 9F:
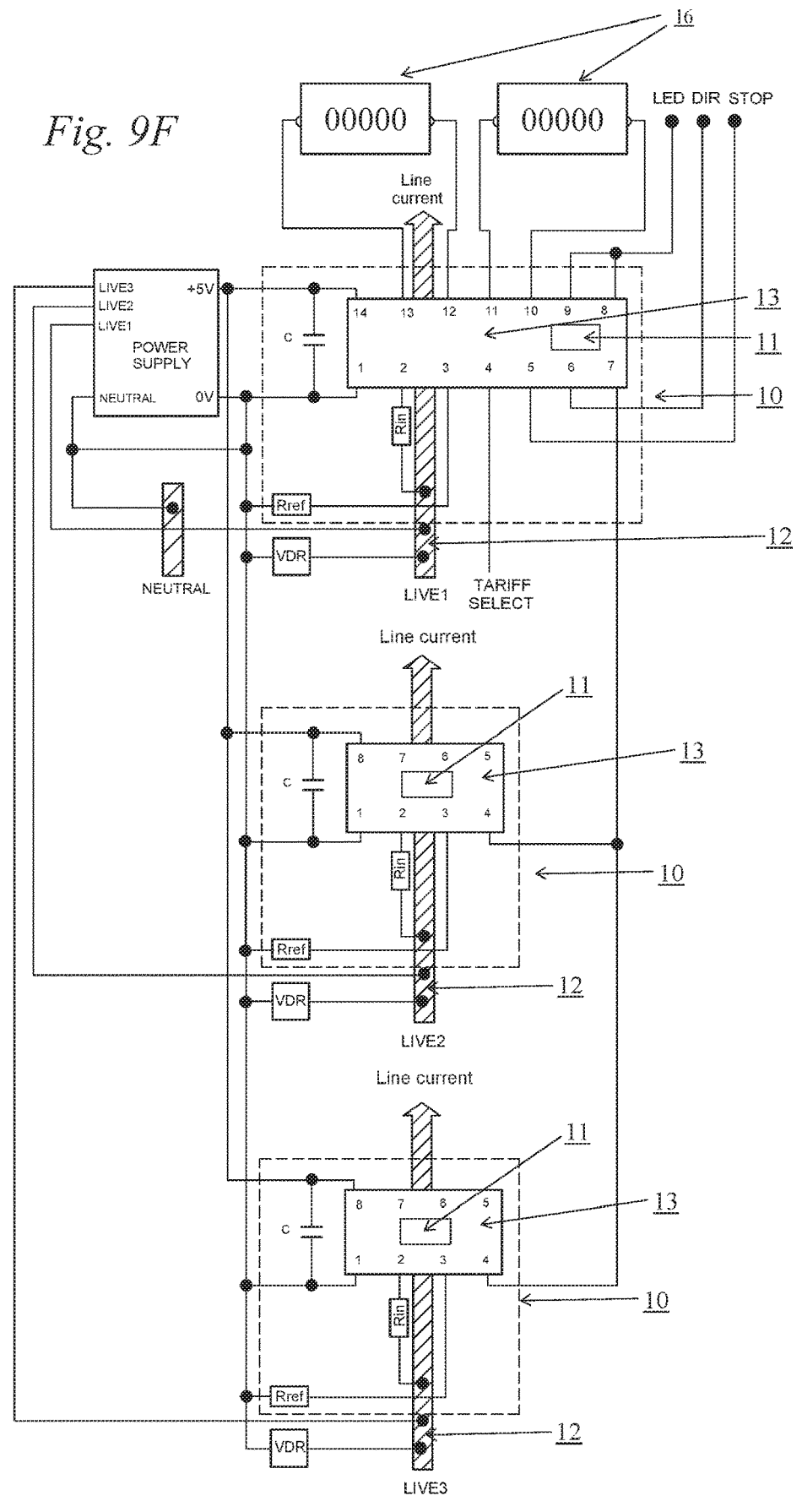
Figure 10:
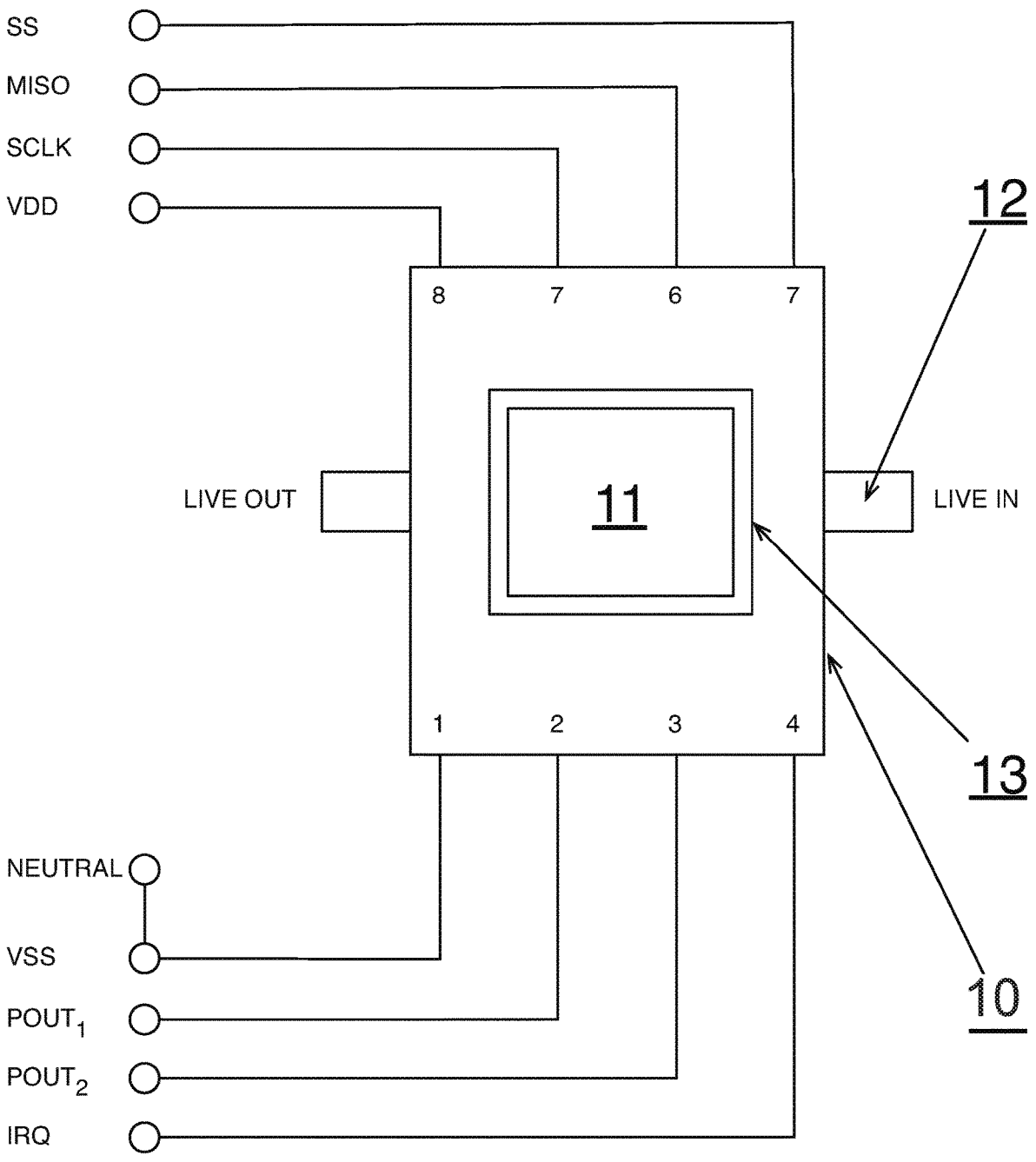
FIG. 10 shows a schematic representation of a power measurement device as in FIGS. 1 to 1B comprising the device in FIG. 7F.
Figure 11A:
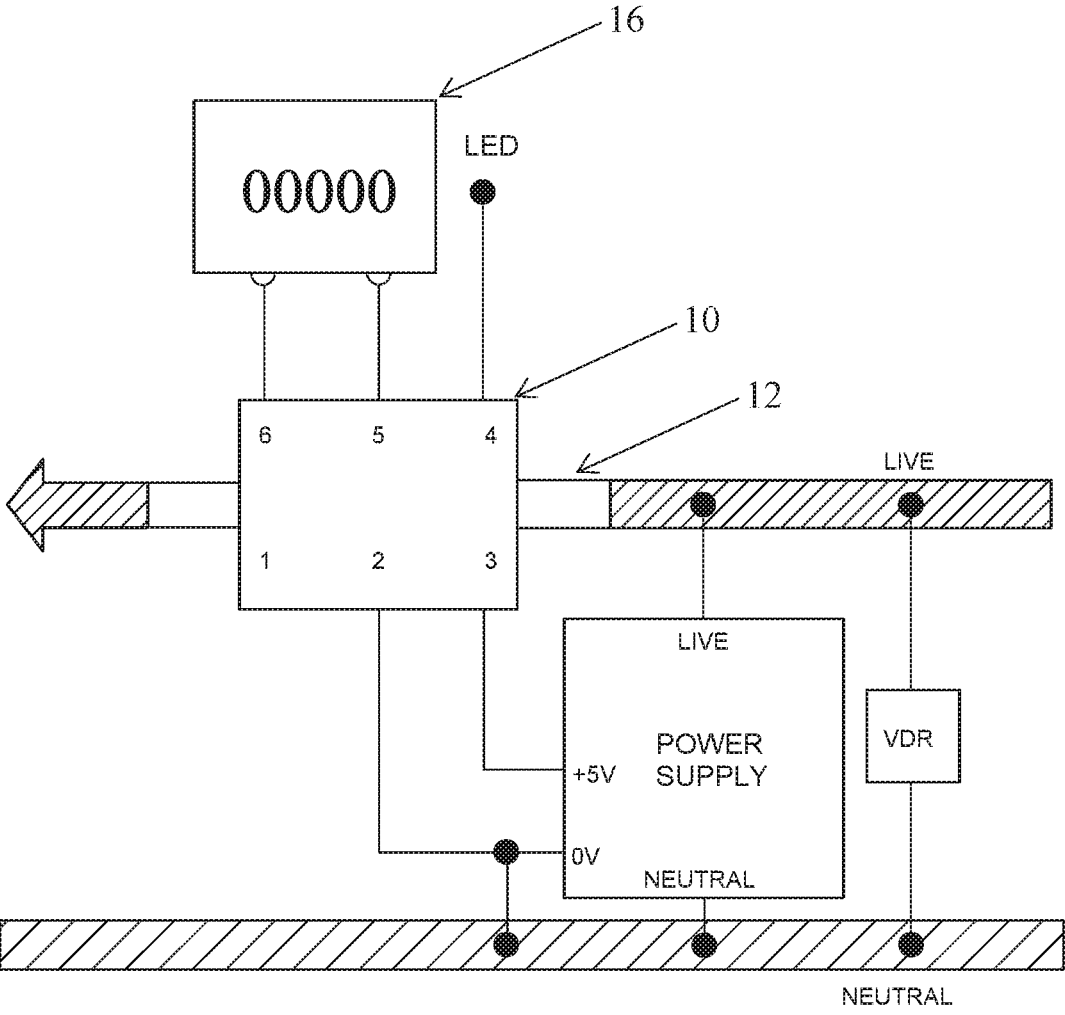
Figure 11B:
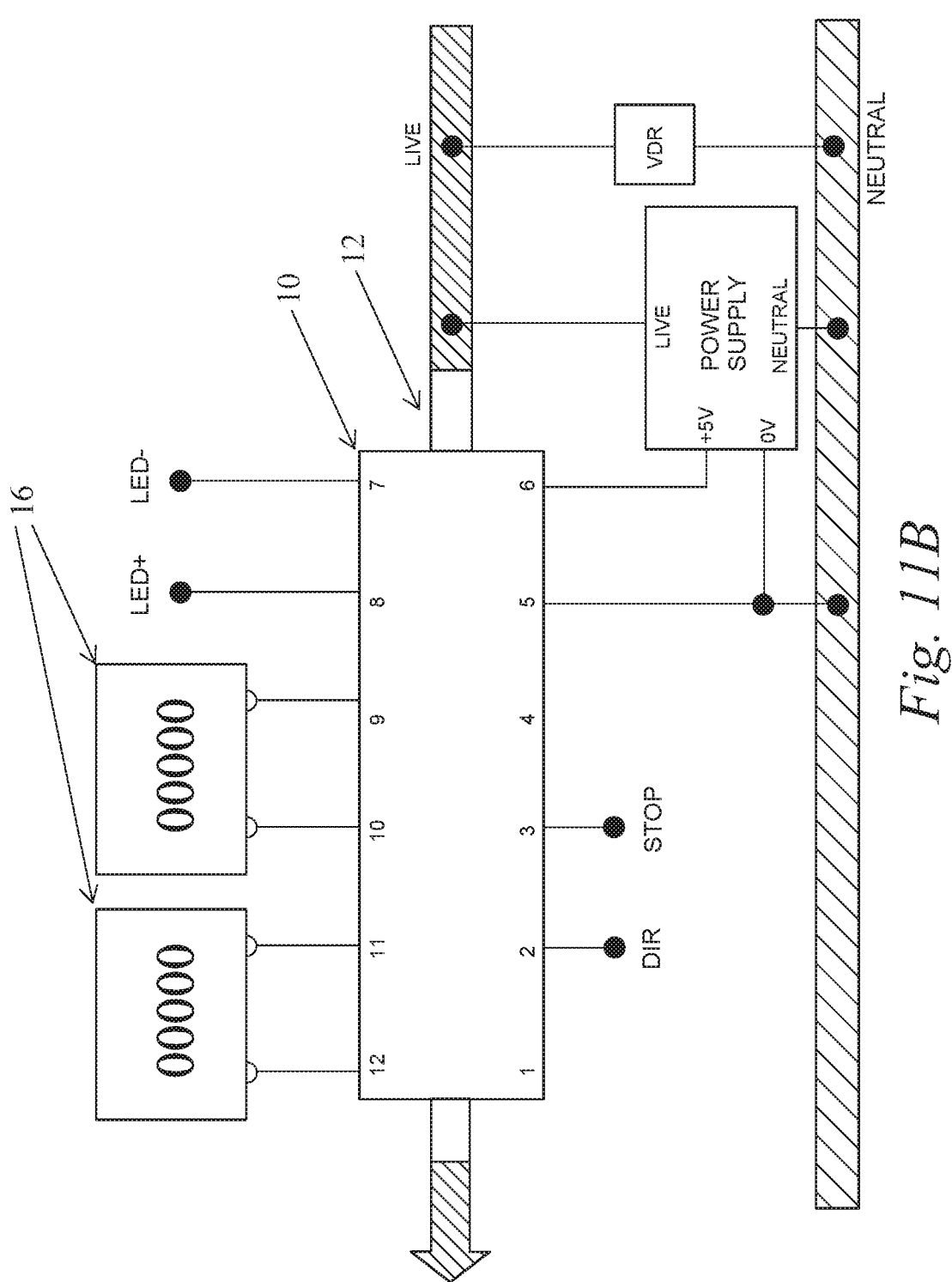
Figure 11C:
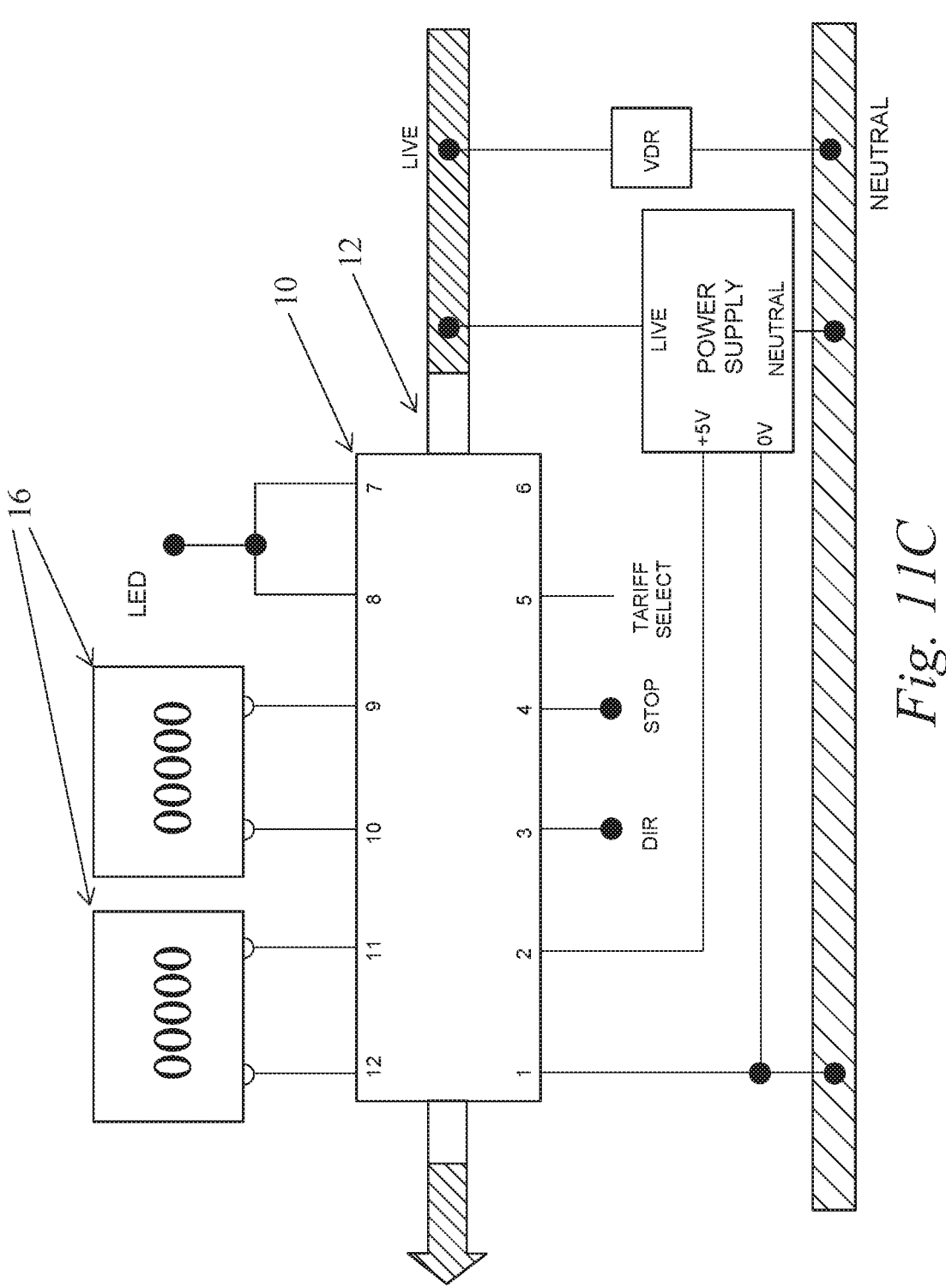
Figure 11D:
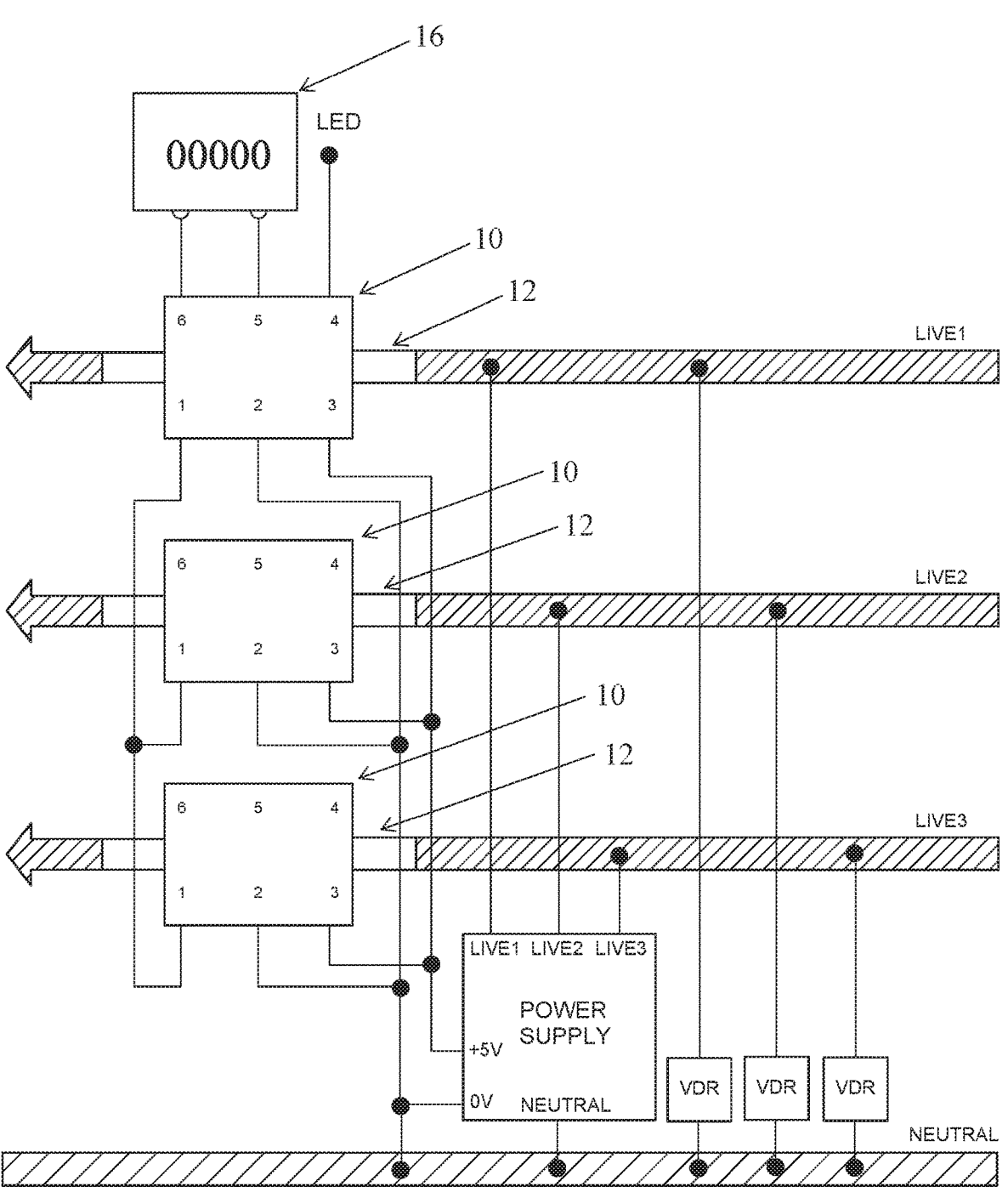
Figure 11E:
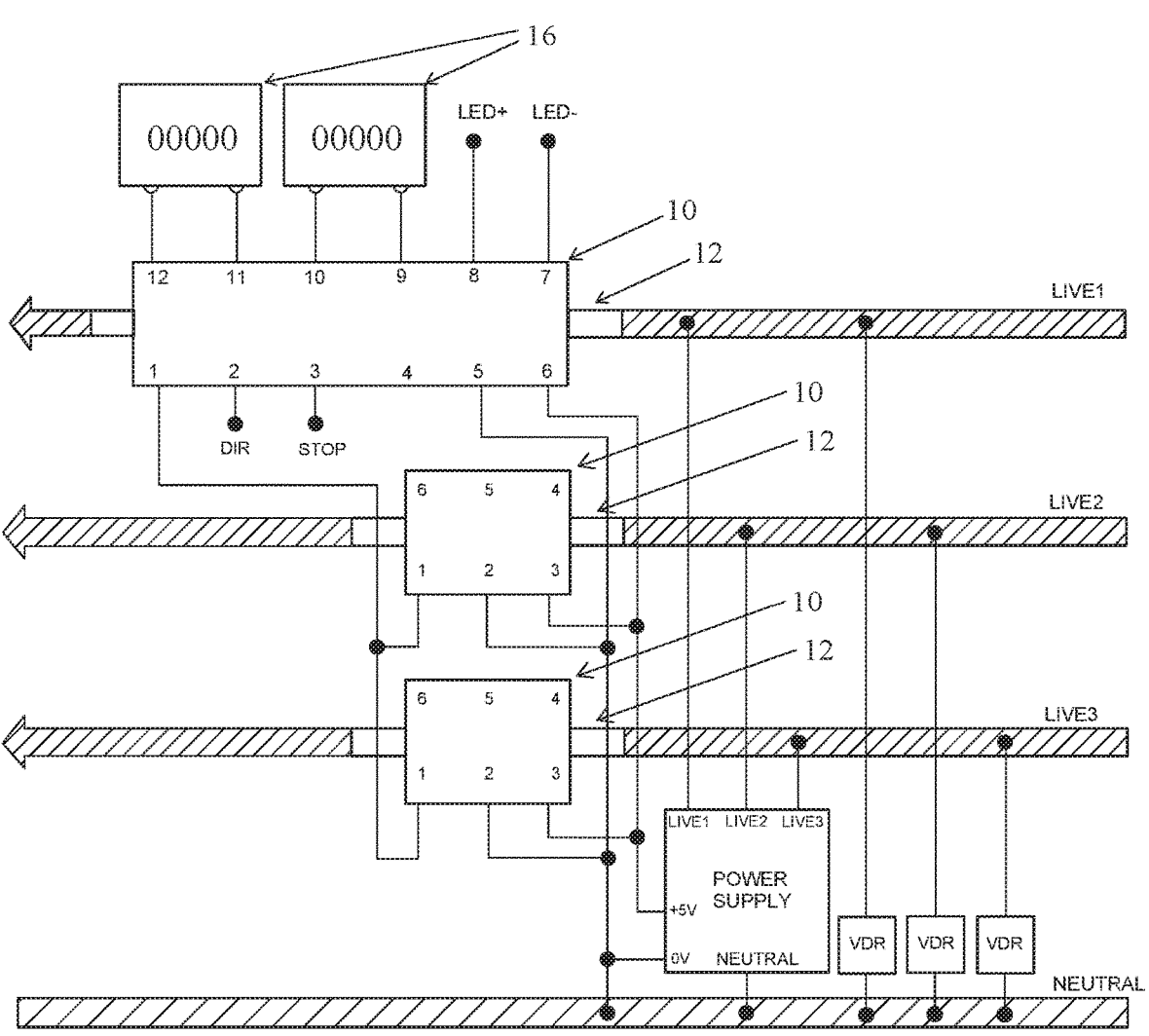
Figure 11F:
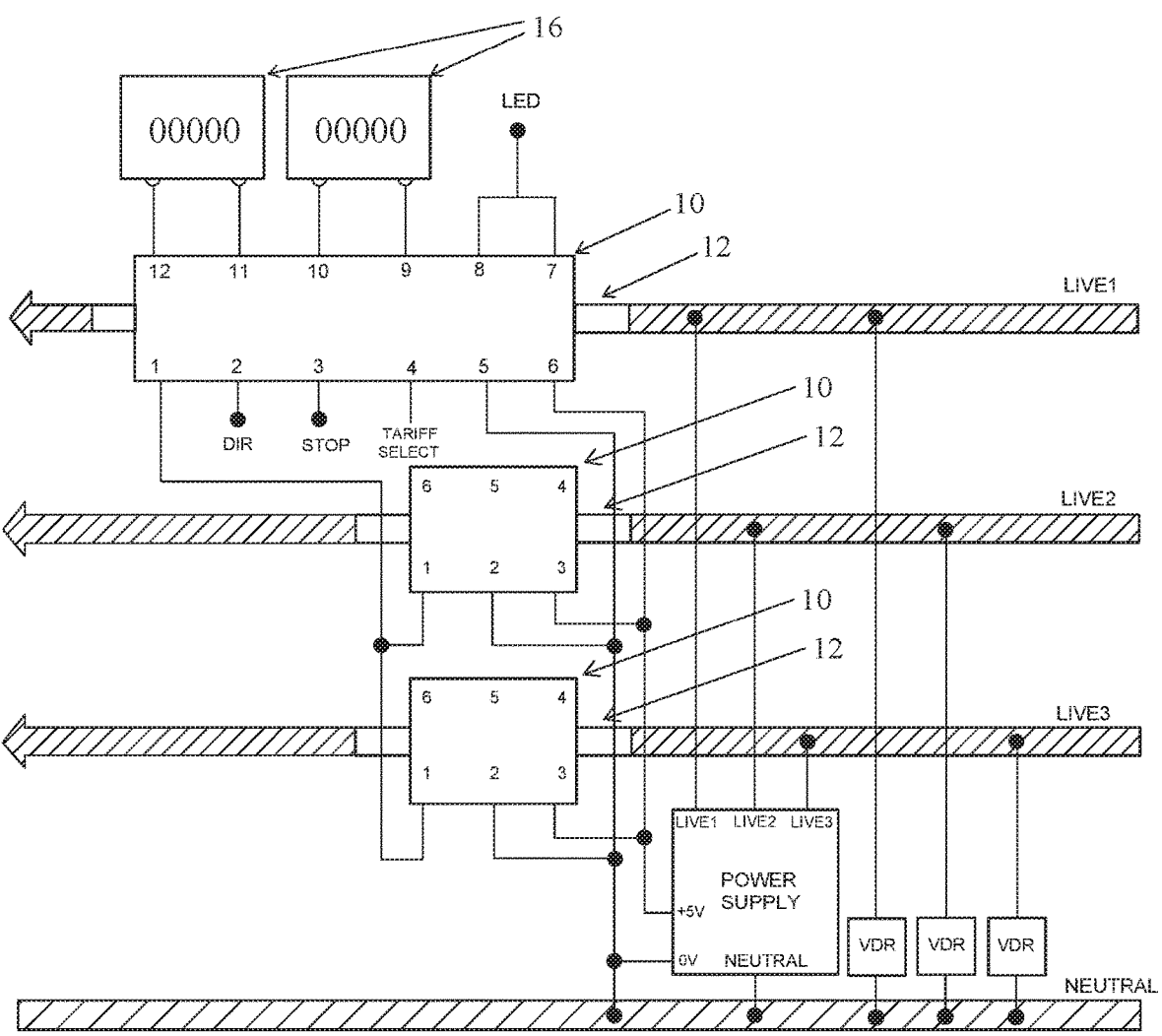
Figure 12:
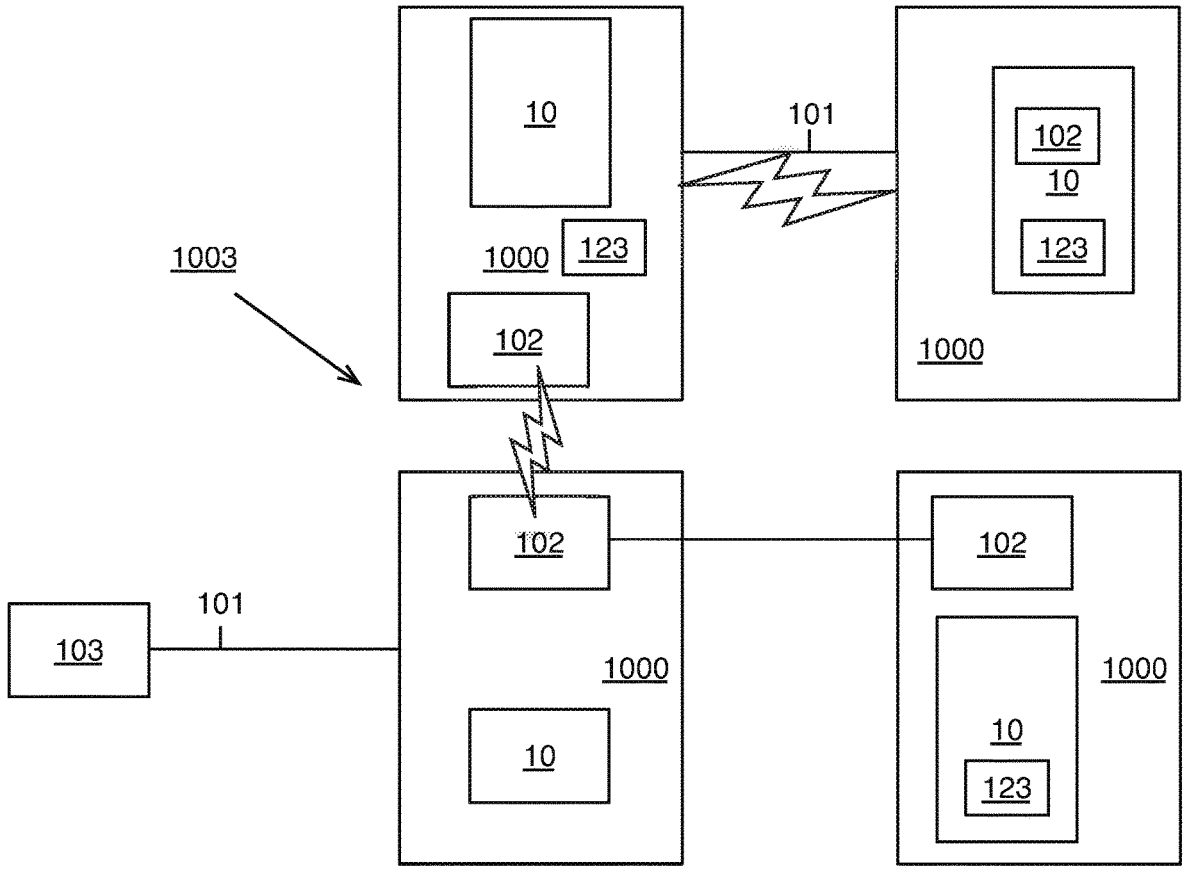
Figure 13:
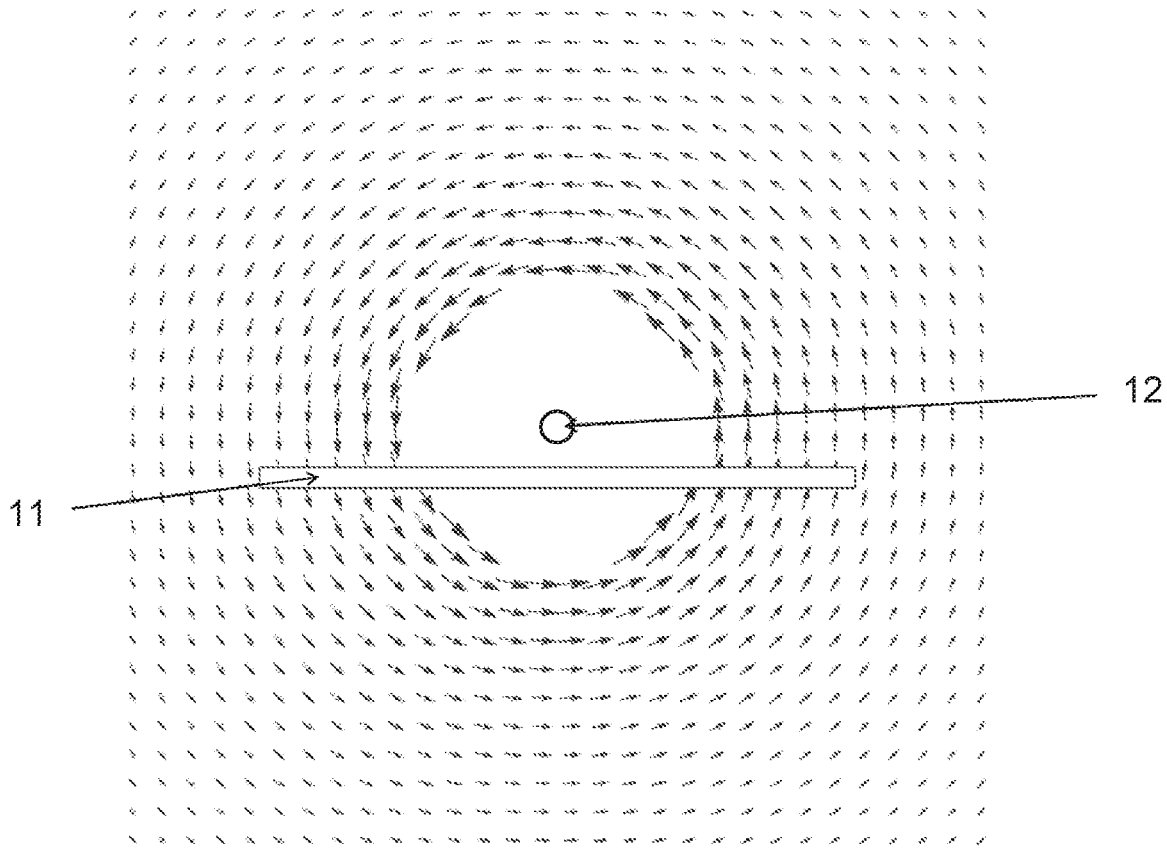
Figure 14A:
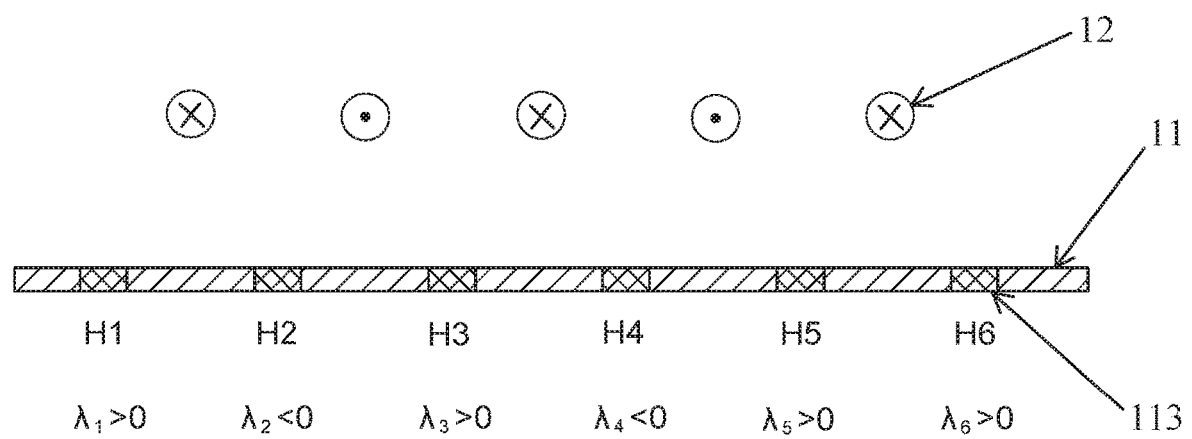

FIGS. 9A to 9F, and 11A to 11F show schematic representations of electromechanical meters; in which FIG. 9A shows a schematic illustration of an example electromechanical meter comprising the part in FIG. 4C or the encapsulated part in FIG. 6D in a single phase application, measuring positive energy flow only;

FIG. 9B shows a schematic illustration of an example electromechanical meter comprising the part in FIG. 4C or the encapsulated part in FIG. 6C in a single phase application, measuring both positive and negative energy flow; and FIG. 9C shows a schematic illustration of an example electromechanical meter comprising the part in FIG. 4C or the encapsulated part in FIG. 6C in a single phase dual-tariff application, measuring positive energy flow only; and FIG. 9D shows a schematic illustration of an example electromechanical meter comprising the part in FIG. 4C or the encapsulated part in FIG. 6D in a three phase application, measuring positive energy flow only; and FIG. 9E shows a schematic illustration of an example electromechanical meter comprising the part in FIG. 4C or the encapsulated parts in FIGS. 6C and 6D, in a three phase application, measuring both positive and negative energy flow; and FIG. 9F shows a schematic illustration of an example electromechanical meter comprising the part in FIG. 4C or the encapsulated parts in FIGS. 6C and 6D, in a three phase dual-tariff application, measuring positive energy flow only; and FIG. 11A shows a schematic illustration of an example electromechanical meter comprising the device in FIG. 7D in a single phase application, measuring positive energy flow only;

FIG. 11B shows a schematic illustration of an example electromechanical meter comprising the device in FIG. 7C in a single phase application, measuring both positive and negative energy flow; and FIG. 11C shows a schematic illustration of an example electromechanical meter comprising the device in FIG. 7C in a single phase dual-tariff application, measuring positive energy flow only; and FIG. 11D shows a schematic illustration of an example electromechanical meter comprising the device in FIG. 7D in a three phase application, measuring positive energy flow only; and FIG. 11E shows a schematic illustration of an example electromechanical meter comprising the devices in FIGS. 7C and 7D in a three phase application, measuring both positive and negative energy flow; and FIG. 11F shows a schematic illustration of an example electromechanical meter comprising the devices in FIGS. 7C and 7D in a three phase dual-tariff application, measuring positive energy flow only; and FIG. 12 shows a schematic representation of a network of systems comprising devices according to the disclosure; and FIG. 13 shows a planar device positioned near a current carrying conductor and the magnetic field lines generated by the conductor;

FIGS. 14A. 14B, 15, 16A to 16D, 17 and 18 show miscellaneous non-limiting examples of a planar part of a device according to the present disclosure containing magnetic field sensors arranged in proximity to a shaped current carrying conductor.

In the drawings, like reference numerals are used to indicate like elements.

A device according to the present disclosure may provide a measure of a quantity dependent on the current through an electrical conductor (such as by way of a non-limiting example only, power or reactive power) using measurement provided by a sub-system comprising sensing circuitry containing sensors arranged adjacent to the electrical conductor. In some examples, the sensing circuitry is maintained in a fixed and spaced relationship to the electrical conductor by an encapsulating and insulating material, so all calibration can be performed during manufacture and no calibration by the user is required.

In some examples, a device according to the present disclosure may be configured so that the sub-system may comprise at least one semi-conductor substrate.

In some examples, a device according to the present disclosure may be configured so that the sensors may be magnetic field sensors.

In some examples, a device according to the present disclosure may be configured so that the magnetic field sensors may be Hall elements.

Alternatively or additionally, a device according to the present disclosure may be configured to be mounted in an external module or on an external circuit board (such as, by way of a non-limiting example only, a Printed Circuit Board (PCB)), with the electrical conductor either forming a part of the external module or circuit board or being external to it, and calibration by the end user after final assembly may be necessary.

In the context of the present disclosure, it may be provided a device for measuring a quantity dependent on the current through an electrical conductor which integrates both the current and the voltage sensors and the processing circuitry for calculation of the quantity in a small form factor, with, in some examples, a diameter of only a few millimetres.

Alternatively or additionally, a device according to the present disclosure may not need a large number of external components. This may allow cheaper cost of manufacturing and less space usage.

A device according to the present disclosure may be small enough to be used in applications where space is at a premium, and may—together with all the required external components-fit into miniaturized devices where no existing power measurement device will fit (with the socket of a light bulb and an electrical plug as non-limiting examples), and may be inexpensive enough to be used in applications where cost is an issue, such as high volume low cost consumer devices (with a light bulb and an electrical plug as non-limiting examples).

Alternatively or additionally, a device according to the present disclosure may measure the quantity accurately. Alternatively or additionally, a device according to the present disclosure may contain all the required metrology compensations. Alternatively or additionally, a device according to the present disclosure may further comprise a module for compensation of temperature coefficients of current and/or voltage sensing elements and/or other sources of temperature dependence, such as the mechanical assembly. Alternatively or additionally, a device according to the present disclosure may further comprise a module for compensation of offsets by the current and/or voltage sensors and/or other analogue electronics. Alternatively or additionally, a device according to the present disclosure may be configured to be a plug-and-play device, and in some examples no calibration of the device may be necessary. This may allow ease of implementation by a user, may allow use by users who have no metrology know-how and may further allow ease of use in retrofit situations.

Alternatively or additionally, a device according to the present disclosure may include means for rejection of stray electromagnetic fields. In such examples, the device may not need to be shielded to provide an accurate reading. In some examples, this may be achieved by means which completely reject all stray magnetic fields with spatial dependence which is polynomial of a given bounded order, and thus providing good rejection of all fields whose spatial dependence may be well approximated by a polynomial of a given bounded order. In some examples, this may be achieved by the device containing one or more magnetic field sensors to measure the current contactlessly by sensing the magnetic field the current generates, with the number and the spatial arrangement of the magnetic field sensors in the device and the way the outputs of the magnetic field sensors are combined chosen so as to completely reject stray electromagnetic fields with spatial dependence which is polynomial of a given bounded order.

Alternatively or additionally, a device according to the present disclosure may include means of maximizing the strength of the useful signal while rejecting stray electromagnetic fields without any need for external shielding. In some examples, this may be achieved with special shaping of the current conductor and a special spatial arrangement, which in some examples may be fixed, between the magnetic field sensors and the current conductor.

Alternatively or additionally, a device according to the present disclosure may sense current contactlessly, giving an isolated reading without needing any additional isolation circuitry.

Alternatively or additionally, a device according to the present disclosure may have low levels of noise and may not require the use of a field concentrator.

Alternatively or additionally, a device according to the present disclosure may in some examples simultaneously measure several quantities dependent on the current through a conductor, either integrating several measurement apparatuses or time multiplexing a single measurement apparatus, or containing several measurement apparatuses and time multiplexing some of them.

Thus, a device according to the present disclosure may in some examples provide an accurate measurement of both electrical real power and reactive power.

Alternatively or additionally, a device according to the present disclosure may in some examples provide also an accurate measurement of the RMS line voltage.

Alternatively or additionally, a device according to the present disclosure may in some examples provide also an accurate measurement of apparent power and/or RMS line current and/or power factor and/or phase angle and/or line frequency, with measurements performed in a novel way.

Alternatively or additionally, a device according to the present disclosure may in some examples further comprise a temperature sensor, permitting each system of which it forms a part to also measure temperature, which may be useful in a number of applications, such as in a house heating and/or thermostat system.

Alternatively or additionally, a device according to the present disclosure may be configured to operate in a normal mode or in a sleep mode. The sleep mode may allow low power operation in which the device may consume very little power, e.g. as a non-limiting example, microwatts only of power, thus potentially enhancing the life span of a power supply and/or reducing power consumption. The device may be configured to operate in the sleep mode during a great proportion of the total operation of the device, e.g. as a non-limiting example, 90% of the total time of operation, whilst still providing accurate measurement.

Alternatively or additionally, a device according to the present disclosure may in some examples comprise one or more input-outputs which may be unidirectional (inputs or outputs) or bidirectional (input-outputs) and which may in some examples be analog, digital or multi-level input-outputs and may in some examples form a part of an analog, digital or mixed signal interface (such as, by way of a non-limiting example only, a Serial Peripheral Interface (SPI)). In some examples, some of these outputs may signal the occurrence of an event (such as, by way of a non-limiting example only, a fixed quantum of one of the quantities the device measures being reached), which may by way of non-limiting examples be done either by outputting pulses or cycling transitions between a finite set of fixed voltage levels (such a by way of a non-limiting example, high and low). Alternatively or additionally, in some examples, some of these outputs may provide readings of continuous variables, such as by way of a non-limiting example, a Pulse Width Modulated (PWM) output, with pulse width related to the value of one of the quantities the device measures, or an analogue voltage output, with the voltage related to the value of one of the quantities the device measures. Alternatively or additionally, in some examples, some of these outputs may be configured to drive a mechanical display directly. Alternatively or additionally, in some examples, some of these outputs may provide readings of discrete variables (such as, by way of non-limiting examples only, the direction of energy flow: an indicator that the total amount of power flow is below a certain threshold (sometimes referred to as "creep current" or "creep power")). Alternatively or additionally, in some examples, at least one of these outputs may signal the occurrence of the end of an AC mains voltage cycle and that the device has data available to read. Alternatively or additionally, in some examples, some of these inputs may select and control various functions of the device.

Alternatively or additionally, a device according to the present disclosure may provide a reading of the signed quantities it measures on a single output, or it may provide them on two outputs, one for the positive part and one for the negative part.

Alternatively or additionally, a device according to the present disclosure may in some examples incorporate at least one communication line, allowing applications not only in single phase energy measurement, but also poly-phase energy measurement, by using several devices (in some examples, one per phase) with the several devices communicating between each other using at least one (and in at least some non-limiting examples, a single) communication line and calculating the total power among the phases automatically without the use of any additional components.

Alternatively or additionally, a device according to the present disclosure may provide built-in support for multi-tariff metering, providing a separate output or outputs for each tariff and may also provide a tariff select input.

Alternatively or additionally, a device according to the present disclosure may be configured to have input-output signals compatible with Complementary Metal-Oxide-Semiconductor (CMOS) and/or Transistor-Transistor Logic (TTL).

Alternatively or additionally, in some examples, a device according to the present disclosure may be used in conjunction with external or internal circuitry providing either wireless connectivity (with WIFI, Bluetooth or mobile telephony as non-limiting examples) or wired connectivity (with powerline communications or Ethernet as non-limiting examples), which may be useful in many applications (with any network of inter-connected devices or Internet-of-Things applications as non-limiting examples). When so used, the whole assembly may be small enough to fit into a miniaturized device (with the socket of a light bulb, an electrical plug and an electrical socket as non-limiting examples), and may be inexpensive enough to permit use in high volume low cost consumer devices (with a light bulb, an electrical plug and an electrical socket as non-limiting examples).

In some examples, a device according to the present disclosure comprises a sensing and processing sub-system, an electrical conductor configured to conduct a current and means of maintaining the electrical conductor in a fixed and spaced relationship to the sensing and processing sub-system. In some examples this may be achieved by encapsulating the sensing and processing sub-system and the electrical conductor in a common enclosure. In other examples, the sensing and processing sub-system may be encapsulated and affixed (such as by way of non-limiting examples only, in an integrated circuit package, as a chip-on-board (COB) or as flip chip) to an external module or circuit board (such as, by way of a non-limiting example only, a PCB), with the electrical conductor being either a track comprising a part of the module or circuit board, or a conductor external to the module or circuit board. One of the numerous advantages of the device according to the present disclosure is that calibration of the device is simple because of the fixed relationship between the electrical conductor and the sensing and processing sub-system, and that in some examples, full calibration can be performed during manufacturing, with no further calibration by the user of the device being required.

A device according to the present disclosure may be an inexpensive, simple but accurate way to measure quantities dependent on the current through a conductor (such as, by way of non-limiting examples only, power and reactive power), because of the small size and the absence of requirements for external components.

A device according to the present disclosure may have numerous applications and may be implemented in numerous systems. A device according to the present disclosure may be implemented, as non-limiting examples, in an electrical socket connected to the mains: an electrical plug configured to be connected to the mains via an electrical socket: an electrical adapter configured to be connected to the mains via an electrical socket and/or electrical plug: a light bulb: an electrical meter; a domestic appliance: any electrical device: any combination of the foregoing or in any smart system which may form part of a network of inter-connected devices or an Internet-Of-Things (IoT).

FIGS. 1 to 3A and 7 to 7F illustrate examples of a device 10 according to the present disclosure. In these examples, the device 10 comprises:

at least one electrical conductor 12 (which by way of non-limiting examples only, may be a wire, a busbar, a printed circuit board (PCB) track; and may, by way of non-limiting examples only, be a simple straight conductor or may be shaped, as discussed further below) to conduct a current;

at least one sensing and processing sub-system 11 (which by way of a non-limiting example only, in these figures is a semiconductor substrate) for each electrical conductor 12, comprising a sensing face arranged to be placed adjacent to its corresponding conductor 12;

an insulating substance or substances 13 (which may in some non-limiting examples be a substantially rigid material or materials; and which by way of non-limiting examples only, may in some examples be a blob seal or an integrated circuit package, or a part of a PCB) surrounding and/or encapsulating the sub-systems 11;

means to maintain each electrical conductor 12 in a fixed and spaced relationship adjacent to its corresponding sub-systems 11.

In the examples in FIGS. 1 to 1B and 7 to 7F, the fixed and spaced relationship between each conductor and its corresponding sub-systems 11 is maintained by virtue of being incorporated in the same rigid encapsulating material 13, with electrical conductor 12 being bonded to the integrated circuit package encapsulating its corresponding sub-system 11. In examples in FIGS. 2 to 2C, the fixed and spaced relationship between each conductor and its corresponding sub-systems 11 is maintained by virtue of both being affixed to the rigid element 15 (which may, by way of a non-limiting example only, be a module or a circuit board and which by way of a non-limiting example only, in these figures is a PCB; and which may further in some non-limiting examples form a part of one of the insulating materials 13).

In some examples, the device 10 may further comprise additional components which may be internal or external to an insulating material or materials 13 encapsulating the sub-system 11. In some examples, a decoupling capacitor may be included (denoted C in FIGS. 1B and 8 to 9F). Additionally or alternatively, in some examples, at least one reference resistor, which may be a high precision resistor, may be included (denoted Rref in FIGS. 1B and 8 to 9F). Additionally or alternatively, some examples may not require and/or not incorporate a reference resistor. Additionally or alternatively, in some examples, voltage sensing resistors which internally connect one of the inputs of the sub-system 11 to its corresponding electrical conductor 12, may be included (denoted Rin in FIGS. 1B and 8 to 9F). In other examples, other components may be included.

In some examples, the conductor 12 and the sub-system 11 may be shaped to allow thermal expansion of the conductor 12 with respect to the sub-system 11 during normal operation.

The insulating substance or substances 13 are configured to insulate the electrical conductor 12 from the sub-system 11.

FIGS. 4 to 4E represent examples of parts (which by way of non-limiting example only, in these figures are semi-conductor substrates) according to the present disclosure which may form the sub-system 11, and FIGS. 6 to 6F represent semi-conductor substrates in FIGS. 4 to 4E encapsulated in integrated circuit packages.

The sub-system 11 contains the means to measure at least one quantity Q related to the current through the electrical conductor 12 (with current, rectified current, instant power and instant reactive power being non-limiting examples of quantity Q).

Figures 5, 5A:
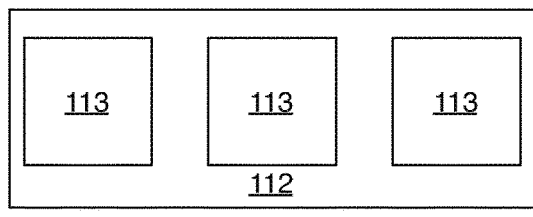
FIG. 5 shows a more detailed schematic view of the parts in FIGS. 4 to 4E.
FIG. 5A shows a more detailed schematic view of selected components of the parts in FIGS. 4 to 4E.

The sub-system 11 will now be further described with reference to the enclosed figures, specifically with reference to FIG. 5. It is to be understood that the blocks in FIG. 5 may not necessarily be arranged within sub-system 11 in the same spatial relationships as in FIG. 5, that they may or may not be spatially interleaved and that not all the examples according to the present disclosure include all the blocks in FIG. 5.

In some examples, the sub-system 11 may comprise sensing circuitry 112 comprising a plurality of magnetic field sensors 113, each providing at least one output. The sensing circuitry 112 may be configured to provide a measure of quantity Q as a combination (which may in some non-limiting examples only be a linear combination, i.e, a weighted sum and/or difference) of magnetic field sensor outputs. To that effect, the sub-system 11 may further comprise a combination module 124 for combining the outputs of the magnetic field sensing elements 113.

In some examples, the magnetic field sensors 113 are arranged so as to be adjacent to an electrical conductor 12 in a normal mode of operation of the device 10.

In some examples, at least some of the magnetic field sensors 113 may be Hall elements and their outputs may be Hall element output voltages.

The sub-system 11 may further comprise a voltage sensing input 114 for sensing a voltage potential (relative to some other voltage potential which may in some non-limiting examples be the ground voltage potential). In some examples, this input may be connected to the voltage potential via a resistor (which may, by way of a non-limiting example only, be a high resistance resistor), thus generating a current (which may, by way of a non-limiting example only, be a small current) into or out of the input 114 which is related to the voltage potential. In some examples, the voltage potential may be a voltage potential associated with a predetermined conductor. In some examples, the predetermined conductor may be conductor 12. In other examples the predetermined conductor may be another conductor (by way of a non-limiting example only, where conductor 12 is the neutral line and the pre-determined conductor is a live conductor).

In some examples, the magnetic field sensors 113 are arranged to be biased by a current derived from and/or related to the current in or out of input 114 and/or thus related to the voltage potential, so that the output from the magnetic field sensors is related to current through conductor 12 and/or the voltage potential. In some examples, the bias current may be taken to be proportional to the voltage potential of the electrical conductor 12, so that the output from the magnetic field sensors and/or the combination module 124 is related to the instant power through conductor 12. In other examples, the bias current may be taken to be proportional to the voltage potential of the electrical conductor 12, phase shifted by 90°, so that the output from the magnetic field sensors and/or the combination module 124 is related to the instant reactive power through conductor 12. In other examples, the bias current may be taken to be constant, so that the output from the magnetic field sensors and/or the combination module 124 is related to the current through conductor 12. In other examples, the bias current may be chosen in a different way.

Figure 1:
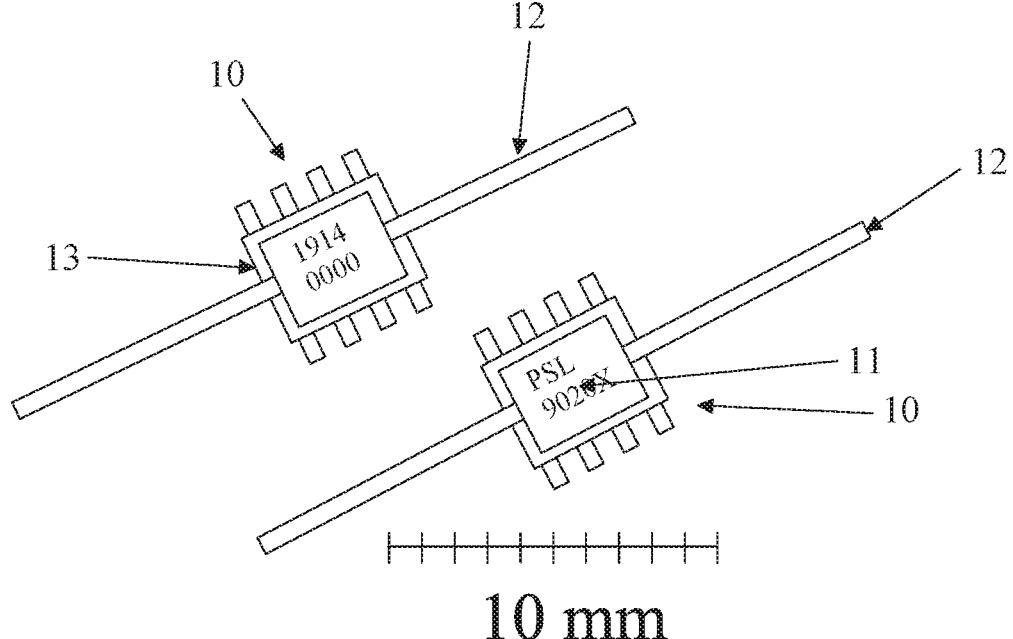
FIG. 1 shows perspective pictures of two faces of a first example of a power measurement device.
Figure 1A:
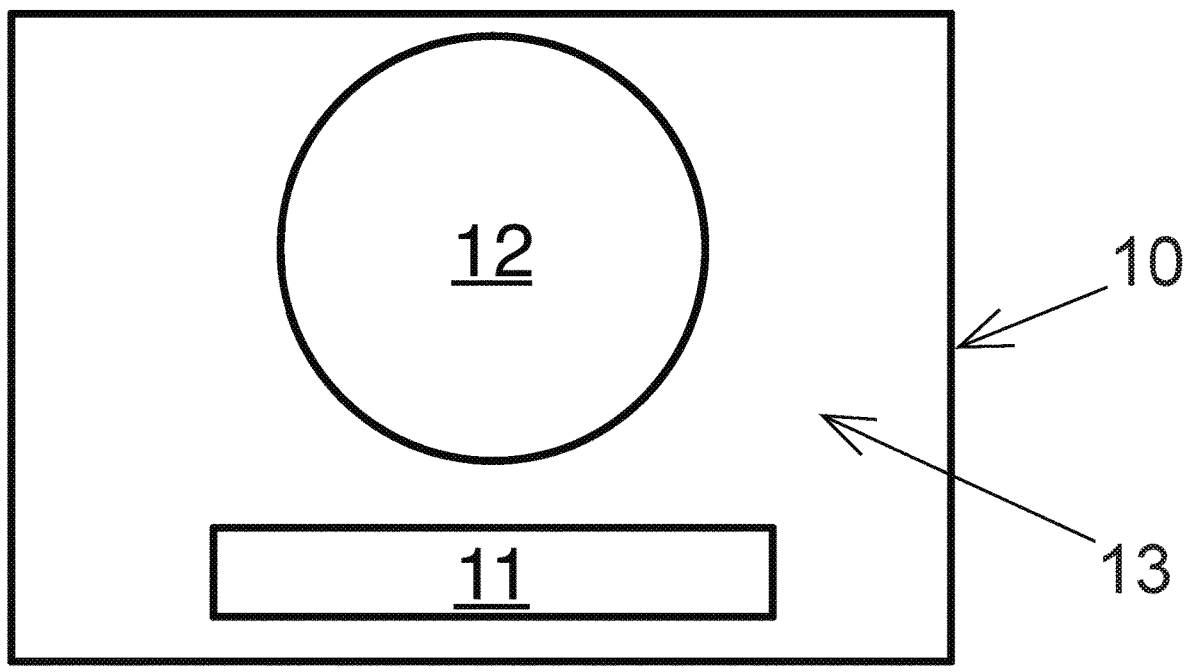
FIG. 1A shows a schematic illustration of a cross section of the power measurement device in FIG. 1.
Figure 2:
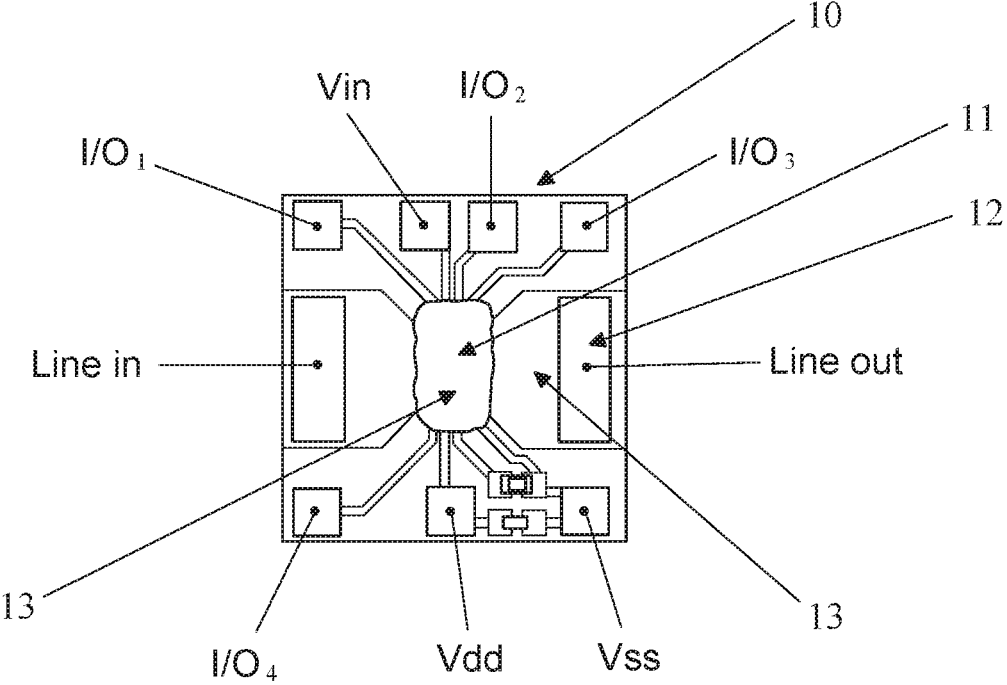
FIG. 2 shows a picture of a second example of a power measurement device.
Figure 2A:
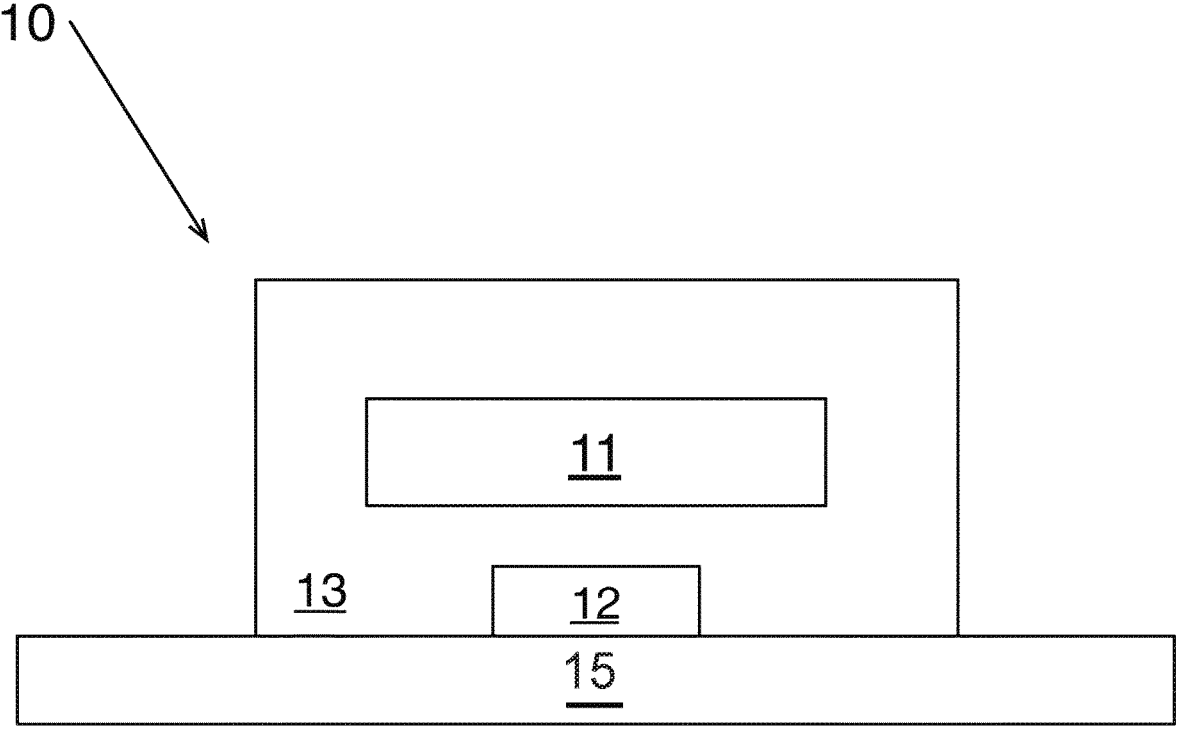
FIG. 2A shows a schematic illustration of a cross section of the power measurement device of FIG. 2.
Figure 2B:
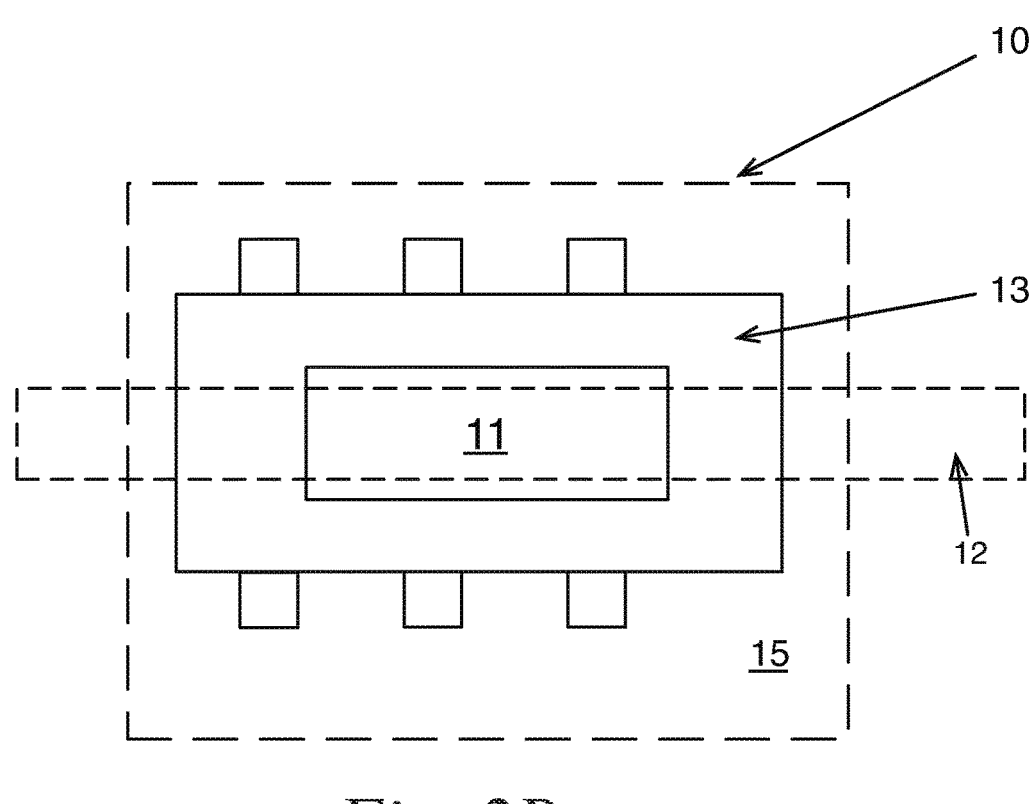
FIG. 2B shows another schematic representation of the device in FIG. 2.
Figure 2C:
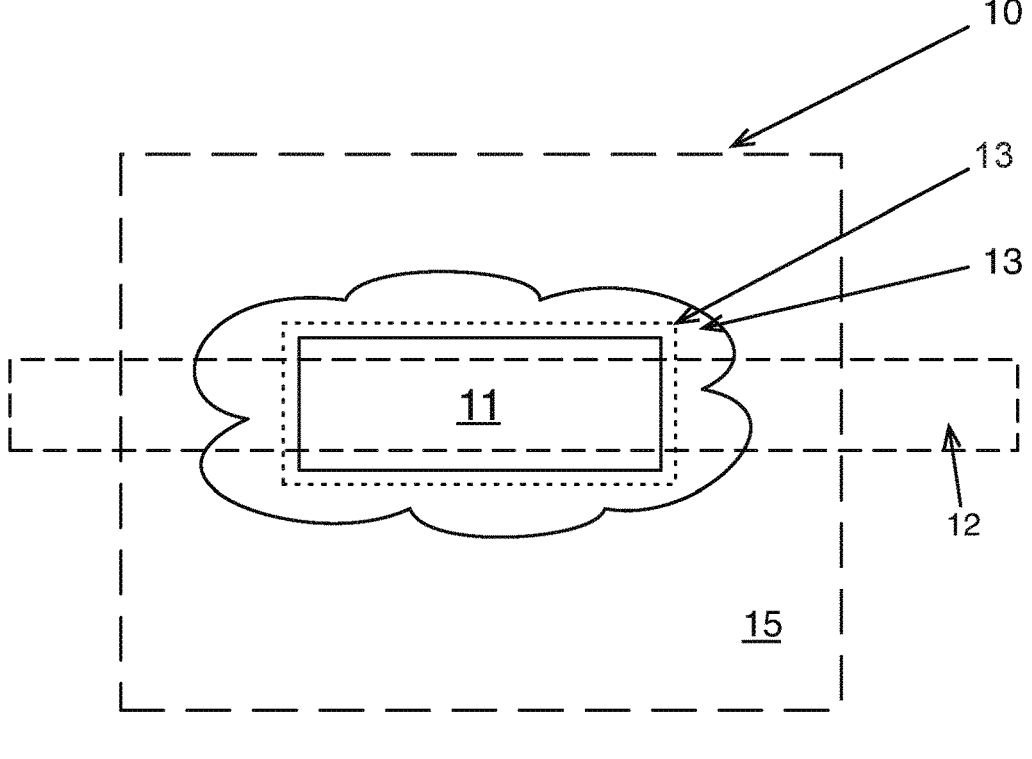
FIG. 2C shows another schematic representation of the device in FIG. 2.
Figure 3:
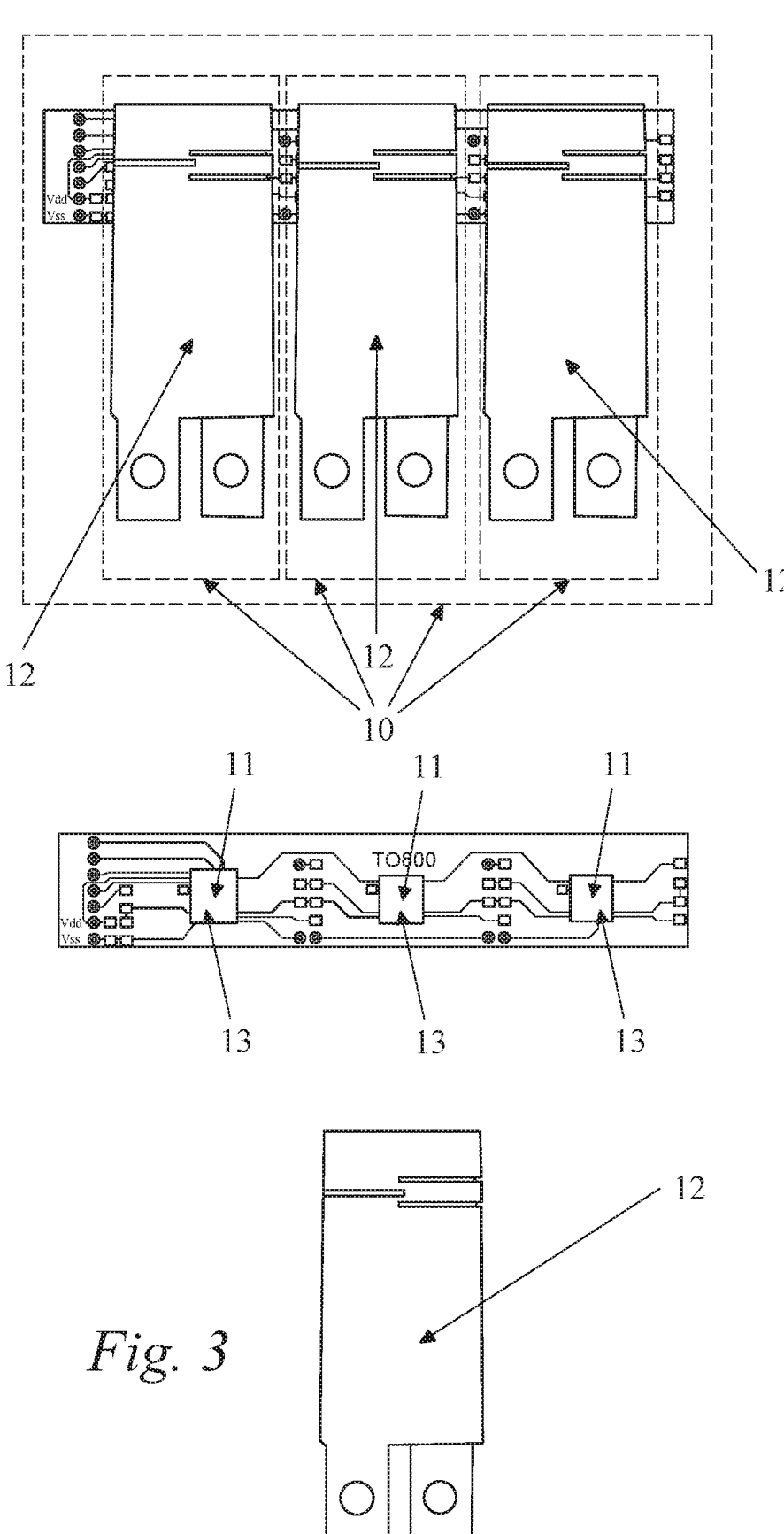
FIG. 3 shows a picture of a third example of a power measurement device.
Figure 3A:
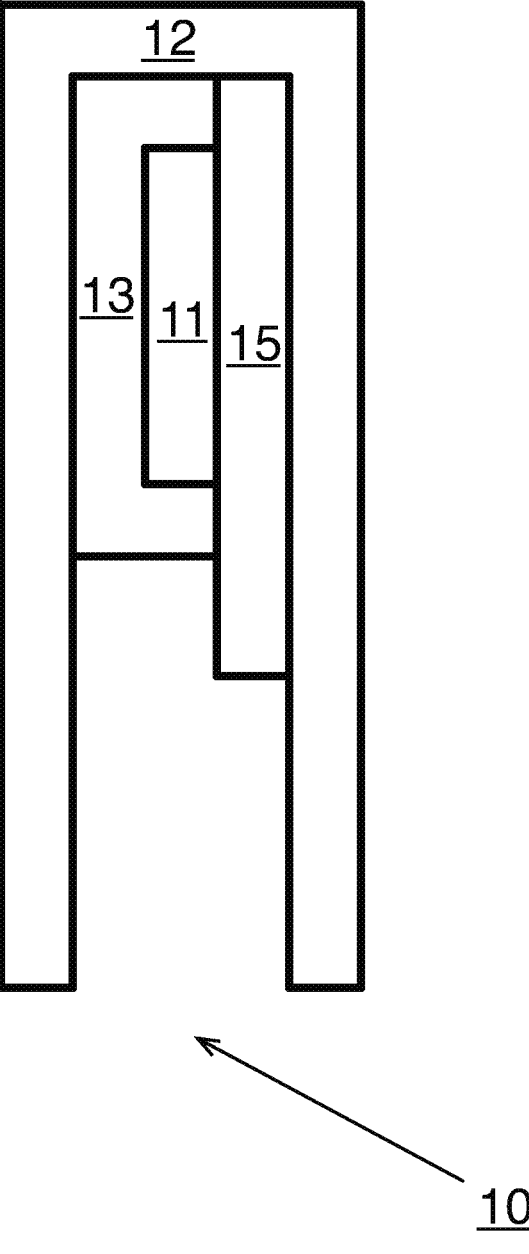
FIG. 3A shows a schematic illustration of a cross section of the power measurement device of FIG. 3.

As a non-limiting example only, the maximum current through conductor 12 may be of the order of a few milli-amperes to a few hundred amperes: by way of a non-limiting example, the device in FIG. 1 is configured for maximum current of 15 A. As a non-limiting example only, the maximum voltages may be of the order of a few hundreds of millivolts to a few thousands of volts; by way of a non-limiting example only, the device in FIG. 1 may be configured for typical voltage of about 110V, 220V or 315V.

Alternatively or additionally, the sub-system 11 may in some examples further comprise a zero-crossing detection module 119 configured to detect at least some of the zero-transitions of the voltage sensing input 114, which correspond to zero-transitions of the AC voltage (by way of a non-limiting example only, in some examples, it may detect rising-edge zero-transitions, in some examples, it may detect falling-edge zero-transitions, and in some examples it may detect both), and may also detect whether they are rising-edge transitions or falling-edge transitions. The reading of the zero-crossing detection module 119 may be used to detect the end of an AC voltage cycle and/or the end of an AC voltage half-cycle. In some examples, the sub-system 11 may provide an output disclosing at least some of the zero-transitions, allowing systems incorporating the sub-system 11 to measure the time interval AT between zero-transitions of the AC voltage and/or the duration of an AC voltage cycle.

The sub-system 11 may further comprise integration circuitry 116 configured to integrate the measure of quantity Q as output by the sensing circuitry 112 and/or the combination module 124 over a complete or a fraction of an AC voltage cycle period. The integration circuitry 116 may in some examples comprise at least one capacitor configured to be charged by a voltage proportional to the measure of quantity Q during the AC voltage cycle period.

In some examples, the integration circuitry 116 is configured to integrate the measure of quantity Q during both halves of a complete AC voltage cycle period by inverting the polarity of the integration of the measure of quantity Q when the AC voltage, for example, changes polarity. The change of polarity of the AC voltage may be detected using a measuring obtained from a zero-crossing module 119.

Additionally or alternatively, the integration circuitry 116 may comprise two capacitors: i.e, one capacitor integrating the measure of quantity Q or its negative over a first half of a complete AC voltage cycle period (for example the positive half of the AC voltage cycle period), and another capacitor integrating the measure of quantity Q or its negative over a second half of a complete AC voltage cycle period (for example the negative half of the AC voltage cycle period), the device being configured to measure the sum or difference of both integrations, as may be appropriate.

In some examples, the integration circuitry 116 may be configured to integrate the measure of quantity Q over a major fraction of a complete AC voltage cycle period (preferably by way of a non-limiting example only, 99.95%), and then output data and reset the sub-system 11 (for example, discharging some capacitors) during another fraction of the complete AC voltage cycle period. The output data corresponding to the complete AC voltage cycle period may be an extrapolation of the data measured during the major fraction of the AC voltage cycle period to the complete AC voltage cycle period. Once the data is output and the sub-system reset after expiration of the minor fraction of the complete AC voltage cycle period, the sub-system 11 is ready for measurement during another AC voltage cycle period.

In some examples, the integration circuitry 116 is configured to preferably always reset (for example, discharge capacitors) after a reading to ensure accurate reading (for example, ensuring that the capacitors are always discharged at a beginning of a measurement period).

Alternatively or additionally, in some examples, the integration circuitry 116 may comprise more than one module (for example, each module comprising at least one capacitor). In some examples, integration circuitry 116 may cycle between the modules so that a different module may be arranged to integrate the measured quantity Q over one complete AC voltage cycle period than the module that was arranged to integrated it over the preceding complete AC voltage cycle period. Alternatively or additionally, in some examples, a first one of the modules may be arranged to integrate the measured quantity Q over a complete AC voltage cycle period and then be used to initialize a second one of the modules, which acts as a buffer, before resetting the first module at the beginning of a new AC voltage cycle period and then using the first module or a third one of the modules to perform the integration over the following complete AC voltage cycle period.

Additionally or alternatively, in some examples, the sub-system 11 may further comprise a module configured to provide an offset compensation function.

In some examples, the sub-system 11 may further comprises a temperature sensor 123. This is useful in a number of applications, by way of a non-limiting example, allowing systems incorporating device 10 to form a part of a house heating and/or thermostat system.

In some examples, the sub-system 11 may further comprise a module 118 configured to provide a temperature compensation function.

The circuitry of the sub-system 11 may be at least partly comprised of a signal processor 111. In the context of the present disclosure, the signal processor 111 may be an analog processor only, a digital processor only, or it may be a mixed signal processor. Additionally or alternatively, in some examples, the signal processor 111 may further comprise means to quantize at least one of the quantities (with the energy, reactive energy and the integral of rectified voltage as non-limiting examples) measured by the sub-system 11. Additionally or alternatively, in some examples, the signal processor may produce both positive and negative quanta of signed quantities. Additionally or alternatively, in some examples, the signal processor 111 may further comprise at least one up-down counter to count one of these quanta or one of these pairs of quanta (such as by way of a non-limiting example only, the pair of positive and negative quanta of a quantity). Additionally or alternatively, in some examples, the up-down counter may be configured with a threshold, upon the reaching of which it may in some examples generate larger quanta, and in some examples pairs of larger quanta (corresponding to positive and negative larger quanta), after which the up-down counter may be reset. Alternatively or additionally, in some examples, the value of these quanta may be set to correspond to a given fixed frequency of quanta per kWh, which may in some examples be configurable.

In some examples, the sub-system 11 may further comprise calibration circuitry 117 for adjusting gain and/or offset compensation and/or other parameters of the sensing circuitry 112 (by way of a non-limiting example only, the calibration of at least one amplifier of the sensing circuitry 112) and/or the integration circuitry 116 and/or the zero-crossing detection module 119 and/or the signal processor 111 and/or the temperature compensation of the temperature compensation module 118. In some examples (with examples where the current conductor 12 forms an integral part of device 10 assembly as a non-limiting example), these parameters may be fully calibrated during device 10 manufacturing, requiring no further calibration by the user. In other examples (with examples where the current conductor 12 does not form an integral part of device 10 assembly as a non-limiting example), these parameters may be left to the user to calibrate (in some non-limiting examples, after final assembly of device 10 and conductor 12). In some examples, two sets of calibration parameters may be provided, some to be pre-calibrated during manufacturing and some provided to the user to offer some adjustability of the device.

In some examples, the calibration circuitry 117 may be arranged to store at least one calibration parameter. The storage of the calibration element may be performed in a volatile or non-volatile memory forming a part of the sub-system 11, such as, as non-limiting examples, a programmable element (which may in some examples be re-programmable, or may in some examples be only programmable once), and/or a mechanically fusible element, a Zener diode, a laser tuneable element and/or any combination of the foregoing.

It is understood that one of the numerous advantages of the integrated device according to the present disclosure is that calibration of the device 10 is simple and can be performed during a method of manufacturing, prior to packaging for dispatch, because of the fixed relationship between the electrical conductor 12 and the sub-system 11.

In some examples, the sub-system 11 may be configured to measure more than one quantity Q simultaneously. The sub-system 11 may achieve this either by time-multiplexing the same metrology apparatus integrated into it and measuring each such quantity Q for a portion of each AC voltage cycle, for example by high frequency multiplexing, or by means of incorporating several similar metrology apparatuses.

Alternatively or additionally, the sub-system 11 may in some examples further comprise a module to measure the integral (V) of the rectified AC voltage over a complete AC voltage cycle.

In some examples, the sub-system 11 may further comprise a sleep control input and a sleep function provided by circuitry 120 which allows, in a sleep mode of operation, the device to be partially or completely shut down. In some examples, the device 10 is arranged to partially or completely shut itself down at an end of a complete AC voltage cycle period following the assertion of a sleep input. In some examples, the device 10 is arranged to wake up on or shortly after the assertion of a wake input and start measuring at the beginning of a following complete AC voltage cycle period (such as, by way of a non-limiting example, the next immediately following complete AC voltage cycle period). The shut down and/or the wake up is thus performed gracefully.

Additionally or alternatively, in some examples, the signal processor 111 may further comprise input-output circuitry 115. Input-output circuitry 115 may comprise one or several input-output signals, some of which may be unidirectional (inputs or outputs) and some of which may be bidirectional (input-outputs), some of which may be digital and/or multi-level and/or analog, and some of which may change value continuously in time and/or at discrete points in time: some of these input-outputs may support tri-state operation (high impedance state).

In some examples, input-output circuitry 115 may be arranged to output the information measured and/or determined by the sub-system 11 and to provide input signals to control certain functions of the sub-system 11.

In some examples, the sub-system 11 and these input-outputs may be isolated from conductor 12 with the current being sensed contactlessly and the voltage being sensed via a high resistance resistor only, with no isolators being required.

By way of non-limiting examples only, these input-output signals may include pulse-width modulated (PWM) signals, pulse signals, transition signals and signals implementing miscellaneous analog and/or digital and/or mixed signal interfaces.

Additionally or alternatively, in some examples, the input-output circuitry 115 may further comprise at least one output providing an analog value (by way of non-limiting examples only, via an analog voltage output, or the width of a pulse of a pulse-width modulated (PWM) output), with the value of some such outputs related to one of the quantities the sub-system 11 measures, with the amount of total energy flow over a complete AC voltage cycle, the amount of total reactive energy flow over a complete AC voltage cycle, the integral of the rectified AC voltage over a complete AC voltage cycle and the measured temperature, as non-limiting examples. The relationship between the output value and the measured quantity may by way of non-limiting examples be linear or affine (i.e. linear with a constant offset), or it may take the form of some other relationship. In some examples, the value of these outputs may be provided on or shortly after the end of an AC voltage cycle period.

Additionally or alternatively, in some examples, the input-output circuitry 115 may further comprise at least one output representing events (by way of non-limiting examples only of such an output, a pulse output generating pulses, or a transition output generating transitions, such as by way of non-limiting example, cycling transitions between fixed levels of voltages, such as, by way of a non-limiting example only, between a high and a low state: by way of non-limiting examples only of such events being a fixed quantum of one of the quantities the sub-system 11 measures being reached, with positive and negative quanta of signed quantities potentially representing different events). In some non-limiting examples, such an output may be able to represent more than one kind of event (by way of a non-limiting example only, events corresponding to both positive and negative quanta of a quantity; by way of a non-limiting example only, a pulse output may encode several different event types by utilizing several pulse durations, each duration representing one event type).

Additionally or alternatively, in some examples, the input-output circuitry 115 may further comprise circuitry to directly drive a mechanical display (which may in some non-limiting examples be a cyclometer display) without any need for additional external components. In some non-limiting examples, this circuitry may provide differential pairs of specially shaped pulse output signals.

Additionally or alternatively, in some examples, the input-output circuitry 115 may further comprise at least one output providing a discrete value (by way of a non-limiting example, a digital or multi-level output). In some non-limiting examples, these outputs allow direct connection to a display device (such as, by way of a non-limiting example only, an LED) in some systems (such as by way of a non-limiting example only, electricity meters) that may require it. Two non-limiting examples of such an output are an output indicating the current direction of energy flow, and an output indicating whether the amount of power flow exceeds a certain pre-determined fixed threshold or not. In some non-limiting examples, the value of these outputs may be set to change at the end of an AC voltage cycle period depending on the total or average value of energy flow over the preceding AC voltage cycle period.

Additionally or alternatively, in some examples, device 10 may be configured to signal no power flow when the total amount of power flow is below a certain pre-determined fixed threshold.

Additionally or alternatively, in some examples, the input-output circuitry 115 may further comprise at least one digital interface. In some examples, some of these interfaces may be used to provide a means to output some of the quantities measured by the sub-system 11 and/or to select some of sub-system 11's function and/or set some of its calibration parameters. In some non-limiting examples, at least one of these interfaces may be an SPI interface, which will be known to the person skilled in the art. In some non-limiting examples, data on some of these outputs may be made available at the end of an AC voltage period.

Those examples of the sub-system 11 which measure the total active (E) and reactive (E$_f$) energy flow, the integral of the rectified AC voltage (V̄) over an AC voltage cycle period, and which contain a zero-crossing module 119, permit the device 10 and/or the systems incorporating it to determine also the line frequency (f), the apparent energy (E) flow, the real power (P), the reactive power (P$_r$), the apparent power (P$_t$), the RMS voltage (V), the RMS current (I) and the power factor (cos 4) using the following equations, which are known to those skilled in the art:

$$f = \frac{1}{\Delta T}$$

$$Et = \sqrt{E^2 + Er^2}$$

$$P = \frac{E}{\Delta T}$$

$$Pr = \frac{Er}{\Delta T}$$

$$Pt = \frac{Et}{\Delta T}$$

$$V = \frac{\overline{V}}{\Delta T} \times \frac{\pi}{2\sqrt{2}}$$

$$I - \frac{Pt}{V}$$

$$\cos\phi = \frac{E}{Et}$$

For best accuracy, it may be advisable to totalize measurements across several mains periods before performing the above calculations.

In some examples, the device 10 may contain a plurality of at least two field sensors $H_0, \ldots, H_n$ used to measure at least one quantity Q dependent on the field, with the output of the field sensors being combined in a way which offers at least a partial rejection of stray fields.

In some non-limiting examples, all stray fields whose spatial dependence is polynomial of any given fixed bounded degree are rejected.

In some non-limiting examples, each field sensor H may output a scalar signal V(H) which is dependent on the field at the point of the field sensor.

In some non-limiting examples, the device 10 may be configured in such a way and operated in such conditions that each such signal V(H) depends approximately linearly on the field at the point of the field sensor to within the desired accuracy.

In some non-limiting examples, V(H) may depend on a component of the field in a given direction only, such as a direction parallel to a certain line (or equivalently, perpendicular to a certain plane).

In some non-limiting examples, quantity Q may be measured by combining the outputs $V(H_0), \ldots, V(H_n)$ in a linear way so that $$Q=T(Q')Q'=\lambda V(H_0)+ \ldots +AV(H_n)$$

for some constant weightings $\lambda_0, \ldots, \lambda_n$ and some transformation T.

Suppose that an integer $D \geq 0$ is given. In some examples, field sensors $H_0, \ldots, H_n$ may be arranged spatially and their weightings $\lambda_1, \ldots, \lambda_n$ chosen in such a way that their spatial co-ordinates $(x_0, y_0, z_0), \ldots, (x_n, y_n, z_n)$ in some co-ordinate system (and if so, necessarily in every co-ordinate system) satisfy the equations:

$$\sum_{\ell=0}^{n} \lambda_\ell x_\ell^i y_\ell^j z_\ell^k == 0$$

for all $i,j,k \geq 0$ and $i+j+k \leq D$. This condition is necessary and sufficient for the plurality of field sensors $H_0, \ldots, H_n$ to reject all stray fields whose spatial dependence is polynomial of degree at most D. As a set of $$\binom{D+3}{3}$$

linear equations in n+1 unknowns $\lambda_0, \ldots, \lambda_n$ with matrix M, this set of equations has a non-zero solution for any choice of co-ordinates $(x_0, y_0, z_0), \ldots (x_n, y_n, z_n)$ provided that the rank r of M is at most n; and in such a case, the solution space is a vector space of dimension n+1-r. For any spatial arrangement of sensors $(x_0, y_0, z_0), \ldots, (x_n, y, Z)$, there is a unique maximum value of D for which this condition is satisfied, and this D is the maximum number such that outputs of that spatial arrangement of sensors may be linearly combined in a non-trivial fashion so as to reject all fields whose spatial dependence is polynomial of degree at most D.

In some non-limiting examples, field sensors $H_0, \ldots, H_n$ may be arranged so as to be contained in a single plane and their weightings $\lambda_1, \ldots, \lambda_n$ chosen in such a way that, with the co-ordinate system chosen so that the sensors lie in the x-y plane, their planar co-ordinates $(x_0, y_0), \ldots, (x_n, y_n)$ satisfy the equations:

$$\sum_{\ell=0}^{n} \lambda_\ell x_\ell^i y_\ell^j == 0$$

for all $i,j \geq 0$ and $i+j \leq D$. For a planar arrangement of field sensors, this condition is necessary and sufficient for the plurality of field sensors $H_0, \ldots, H_n$ to reject all stray fields whose spatial dependence is polynomial of degree at most D. As a set of $$\binom{D+2}{2}$$

linear equations in n+1 unknowns $\lambda_0, \ldots, \lambda_n$ with matrix M, this set of equations has a non-zero solution for any choice of co-ordinates $(x_0, y_0), \ldots, (x_n, y)$ provided that the rank r of M is at most n; and in such a case, the solution space is a vector space of dimension n+1-r. For any planar arrangement of sensors $(x_0, y_0), \ldots, (x_n, y_n)$, there is a unique maximum value of D for which this condition is satisfied, and this D is the maximum number such that that outputs of that planar arrangement of sensors may be linearly combined in a non-trivial fashion so as to reject all fields whose spatial dependence is polynomial of degree at most D.

In some non-limiting examples, field sensors $H_0, \ldots, H_n$ may be arranged so as to be contained in a single line and their weightings $\lambda_1, \ldots, A_n$ chosen in such a way that, with the co-ordinate system chosen so that the sensors lie in the x-line, their linear co-ordinates $x_0, \ldots, x_n$, satisfy the equations:

$$\sum_{\ell=0}^{n} \lambda_\ell x_\ell^i == 0$$

for all $i \geq 0$ and $i \leq D$. For a linear arrangement of field sensors, this condition is necessary and sufficient for the plurality of field sensors $H_0, \ldots, H_n$ to reject all stray fields whose spatial dependence is polynomial of degree at most D. As a set of D+1 linear equations in n+1 unknowns $\lambda_0, \ldots, \lambda_n$ with matrix M, this set of equations has a non-zero solution for any choice of co-ordinates $x_0, \ldots, x_n$ provided that the rank r of M is at most n; and in such a case, the solution space is a vector space of dimension n+1-r. For distinct $x_0, \ldots, x_n$, this holds if and only if n=D+1. For any linear arrangement of sensors $x_0, \ldots, x_n$, outputs of that linear arrangement of sensors may be linearly combined in a non-trivial fashion so as to reject all magnetic fields whose spatial dependence is polynomial of degree at most D=n−1. In the case of D=n−1, the $\lambda_0, \ldots, \lambda_n$ are given by:

$$\lambda_i == \frac{1}{\prod_{0 \leq j \leq n \wedge j \neq i}(x_j - x_i)} \cdot C$$

where C is an arbitrary constant.

In particular, it will be noted that in this case, the $\lambda_0, \ldots, A_n$ have alternating signs if $x_0, \ldots, x_n$ are ordered, i.e., if $x_0 <, \ldots < x_n$.

In some non-limiting examples, field sensors $H_0, \ldots, H_n$ may be arranged so as to be contained in a single line and so that adjacent pairs of sensors are equidistant, and their weightings $\lambda_0, \ldots, \lambda_n$ may, with the numbering of sensors chosen so that $H_0, \ldots, H_n$ are arranged in order left-to-right on the line, satisfy the equations $$\lambda_i == (-1)^i \cdot \binom{n}{i}$$

For this arrangement of field sensors, this condition is (up to multiplication by a constant) necessary and sufficient for the plurality of field sensors $H_0, \ldots, H_n$ to reject all stray fields whose spatial dependence is polynomial of degree at most $n-1$.

By way of a non-limiting example, $n=2$ gives $(\lambda_0, \ldots, \lambda_n)=(1,-1)$, $n=3$ gives $(\lambda_0, \ldots, \lambda_n)=(1,-2,1)$, $n=4$ gives $(\lambda_0, \ldots, \lambda_n)=(1,-3,3,-1)$ and $n=5$ gives $(\lambda_0, \ldots, \lambda_n)$ $(1,-4,6,-4,1)$.

In some non-limiting examples, at least one of the field sensors $H_0, \ldots, H_n$, say sensor H, whose output weighting is $\lambda$ may comprise of several field sensors $H^1, \ldots, H^n$ located in spatially nearly identical location with weightings $\lambda^{(1)}$ such that $\lambda^{(n)} + \ldots + \lambda^{(n)} = \lambda$.

In some non-limiting examples, where $\lambda_0, \ldots, \lambda_n$ are all small integers, field sensors $H_0, \ldots, H_n$, may comprise of $|\lambda_0| + \ldots + |\lambda_n|$ identical sensors in $n+1$ groups of $|\lambda_0|, \ldots, |\lambda_n|$ sensors, respectively, in spatially nearly identical location, whose weightings are all the same except for the sign.

These spatial arrangements and weightings of field sensors $H_0, \ldots, H_n$ give excellent rejection of stray fields. For example, two cases of common stray electromagnetic fields are AC magnetic fields from a distant source, and low frequency AC magnetic fields generated by a nearby current conductor. Supposing that a single magnetic field sensor $H_0$ gives an output of amplitude A when exposed to an AC field generated by a distant source of angular frequency $\tilde{\omega}$, propagating in a direction at an angle $\theta$ to the line of the sensors, with $\omega = \tilde{\omega} \cdot \cos \theta$, a linear equidistant array of magnetic field sensors $H_0, \ldots, H_n$ whose outputs are combined according to the present disclosure, where the distance between the extreme pair of sensors is d, gives an output of amplitude A times $$\left| 2\sin \frac{\omega d}{2nc} \right|^n$$

where c is the speed of light. Some values of this attenuation for the non-limiting example $d=3$ mm are given in Table 1. This attenuation is monotonic for $0 \leq \omega \leq nC\pi/d$ and equals 1 at $\omega = nC\pi/3d$.

TABLE 1

| f [Hz] | n = 1 | n = 2 | n = 3 | n = 4 |
|---|---|---|---|---|
| 25k | $1.5708 \times 10^{-4}\%$ | $6.1685 \times 10^{-11}\%$ | $1.43548 \times 10^{-17}\%$ | $2.37815 \times 10^{-24}\%$ |
| 250k | $1.5708 \times 10^{-3}\%$ | $6.1685 \times 10^{-9}\%$ | $1.43548 \times 10^{-14}\%$ | $2.37815 \times 10^{-20}\%$ |
| 2.5M | $1.5708 \times 10^{-2}\%$ | $6.1685 \times 10^{-7}\%$ | $1.43548 \times 10^{-11}\%$ | $2.37815 \times 10^{-16}\%$ |
| 25M | $1.5708 \times 10^{-1}\%$ | $6.1685 \times 10^{-5}\%$ | $1.43548 \times 10^{-8}\%$ | $2.37815 \times 10^{-12}\%$ |
| 250M | $1.5708\%$ | $6.1685 \times 10^{-3}\%$ | $1.43547 \times 10^{-5}\%$ | $2.37815 \times 10^{-8}\%$ |
| 2.5G | $15.6918\%$ | $0.61653\%$ | $1.43498 \times 10^{-2}\%$ | $2.37754 \times 10^{-4}\%$ |
| 5G | $31.2869\%$ | $2.46233\%$ | $0.114681\%$ | $3.80113 \times 10^{-3}\%$ |
| 7.5G | $46.6891\%$ | $5.52602\%$ | $0.386385\%$ | $1.92185 \times 10^{-2}\%$ |
| 10G | $61.8034\%$ | $9.7887\%$ | $0.913679\%$ | $6.06308 \times 10^{-2}\%$ |
| 12.5G | $76.5367\%$ | $15.2241\%$ | $1.77903\%$ | $0.147682\%$ |
| 15G | $90.7981\%$ | $21.7987\%$ | $3.06258\%$ | $0.305369\%$ |

TABLE 1-continued

| f [Hz] | n = 1 | n = 2 | n = 3 | n = 4 |
|---|---|---|---|---|
| 25G | no rejection | 58.5786% | 13.8701% | 2.31773% |
| nc/2d | 50 GHz | 100 GHz | 150 GHz | 200 GHz |
| nc/6d | 16.7 GHz | 33.3 GHz | 50 GHz | 66.7 GHz |

Supposing that a single magnetic field sensor $H_0$ gives an output of amplitude A when exposed to a low frequency AC field generated by a nearby conductor, a linear equidistant array of magnetic field sensors $H_0, \ldots, H_n$ whose outputs are combined according to the present disclosure, where the distance between the extreme pair of sensors is d, gives an output of amplitude $\alpha A$, where $\alpha$ is some attenuation factor. Supposing the interfering conductor is located perpendicular to the sensor array at a distance horizontally x from the sensor at one extreme, and distance z away from the plane of the sensors, Table 2 tabulates the attenuation factor $\alpha$ in some examples.

TABLE 2

| z [μm] | x [mm] | n = 1 | n = 2 | n = 3 | n = 4 |
|---|---|---|---|---|---|
| 70 | 3 | 49.9796% | 16.6468% | 4.98872% | 1.42345% |
| 70 | 4 | 42.8454% | 11.6791% | 2.85293% | 0.662836% |
| 70 | 5 | 37.4925% | 8.649% | 1.78385% | 0.349728% |
| 70 | 6 | 33.3283% | 6.66387% | 1.18955% | 0.201772% |
| 70 | 7 | 29.9964% | 5.29239% | 0.832829% | 0.124503% |
| 70 | 8 | 27.2701% | 4.30509% | 0.605768% | 0.0809614% |
| 70 | 9 | 24.998% | 3.57066% | 0.454366% | 0.0549109% |
| 1000 | 3 | 45.9459% | 12.8776% | 2.95952% | 0.556672% |
| 1000 | 4 | 40.5% | 9.9% | 2.06445% | 0.383821% |
| 1000 | 5 | 36% | 7.69942% | 1.42703% | 0.24221% |
| 1000 | 6 | 32.3171% | 6.11087% | 1.00938% | 0.154558% |
| 1000 | 7 | 29.2786% | 4.94856% | 0.734016% | 0.101608% |
| 1000 | 8 | 26.7418% | 4.08011% | 0.547949% | 0.0689596% |
| 1000 | 9 | 24.5977% | 3.41728% | 0.418726% | 0.0482122% |
| 10000 | 3 | 60.2941% | 11.6394% | 0.156187% | 0.148147% |
| 10000 | 4 | 36.2416% | 8.67202% | 0.418081% | 0.0676314% |
| 10000 | 5 | 21.9512% | 6.51978% | 0.484579% | 0.0213895% |
| 10000 | 6 | 12.7072% | 4.89282% | 0.462952% | 0.00329155% |
| 10000 | 7 | 6.42857% | 3.64814% | 0.405124% | 0.0147685% |
| 10000 | 8 | 2.0362% | 2.69442% | 0.337304% | 0.0186676% |
| 10000 | 9 | 1.0929% | 1.96487% | 0.272111% | 0.0185848% |

Alternatively or additionally, the current conductor 12 in device 10 may be shaped in such a way, and may be positioned and meander spatially in such a way in relation to the magnetic field sensors 113 in device 10 that the combined output Q' of the magnetic field sensors gives a reading such that the signal generated by a magnetic field generated by a current flowing in conductor 12 is maximized.

In some examples, conductor 12 is arranged as one or more straight, curved, zigzag and/or coiled sections placed in proximity to the magnetic field sensing elements/sensors, possibly in different orientations.

In some examples, conductor 12 may be placed close to the magnetic field sensors 113. By way of a non-limiting example only, in some examples where the magnetic field sensors 113 lie in a plane and the conductor 12 lies substantially in a plane or a thin collection of planes substantially parallel to the plane of the sensors, the distance between the two planes may be chosen to be a few micrometres only, such as for example 50 μm-100 μm.

Figure 14B:
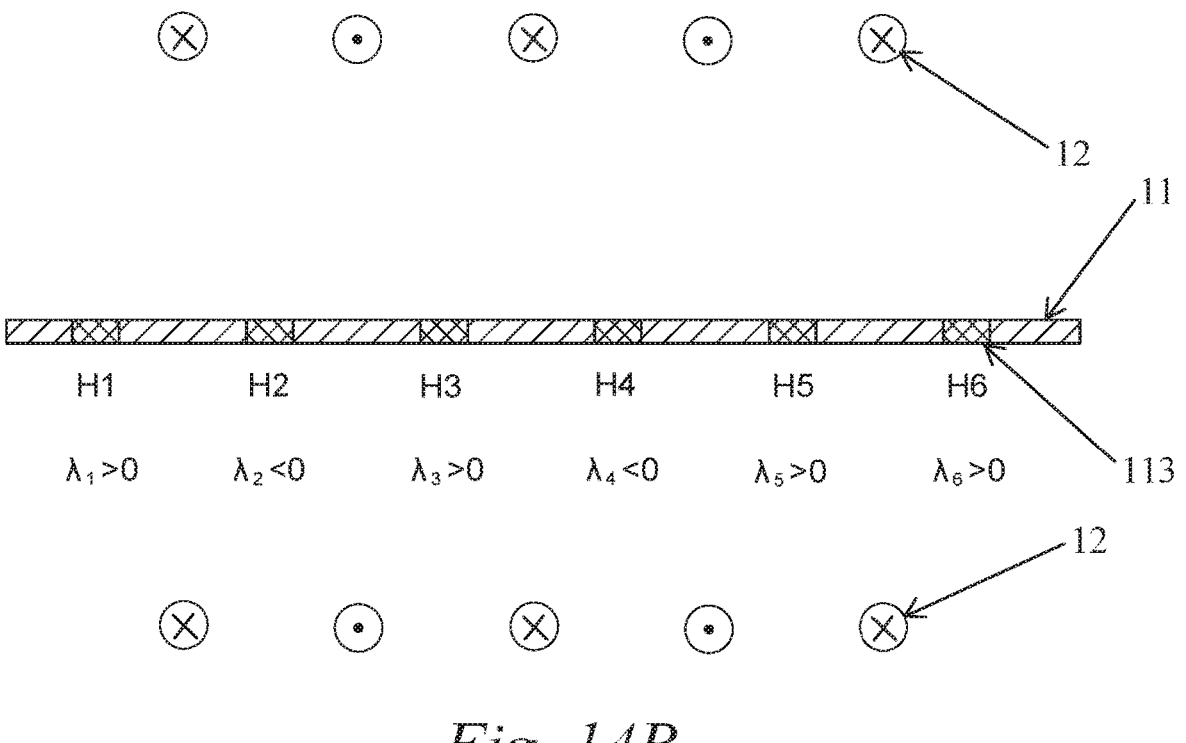

In some non-limiting examples where the magnetic field sensors $H_0, \ldots, H_n$ all lie in a single plane Fl and the output of each sensor is dependent only on the component of the magnetic field at the point of the sensor perpendicular to Π, the conductor 12 may be shaped so as to meander past the sensors in such a way that its effect on the magnetic field is essentially the same as that of a series of conductors $c_0, \ldots, c_m$ (some of which may in some non-limiting examples be linear conductors, and some of which may in some non-limiting examples be concentric (possibly fractional number of) circular windings, of constant or varying radii) located in close proximity to the plane $\Pi$ and substantially parallel to it (where some conductors may be on one side of the plane and some on the other, or they may all be on one side). In some, but not all, non-limiting examples, where all the sensors are contained in a single line l, the local direction of conductors $c_0, \ldots, c_m$ close to the sensors may be perpendicular to the line l. In some non-limiting examples, the conductors $c_0, \ldots, c_m$ may be arranged so that the current flows in some of them past the sensors in different directions, with the directions so chosen that the effects of the magnetic fields generated by the conductors on the combined output of the sensors add constructively. Two non-limiting examples illustrating the cases of a linear arrangement of sensors with n=5, m=4 and n=5, m=9 are given in FIGS. 14A and 14B: it is noted that in other examples, more or fewer conductors may be present, that the conductors may be placed above or anywhere between the sensors, or outside the sensor line and that the directions of current flow in consecutive conductors may or may not be alternating. In some, though not all, non-limiting examples, m is 1, 2 or 3, the conductors are straight linear conductors perpendicular to the line of the sensors, arranged substantially symmetrically around the centre of the sensors.

Some non-limiting examples of this aspect of the present disclosure are shown in FIGS. 15 to 18. Each of these figures shows;

a current conductor 12 a planar sensing sub-system 11, comprising magnetic field sensors 113 $H_0, \ldots, H_n$.

Figure 15:
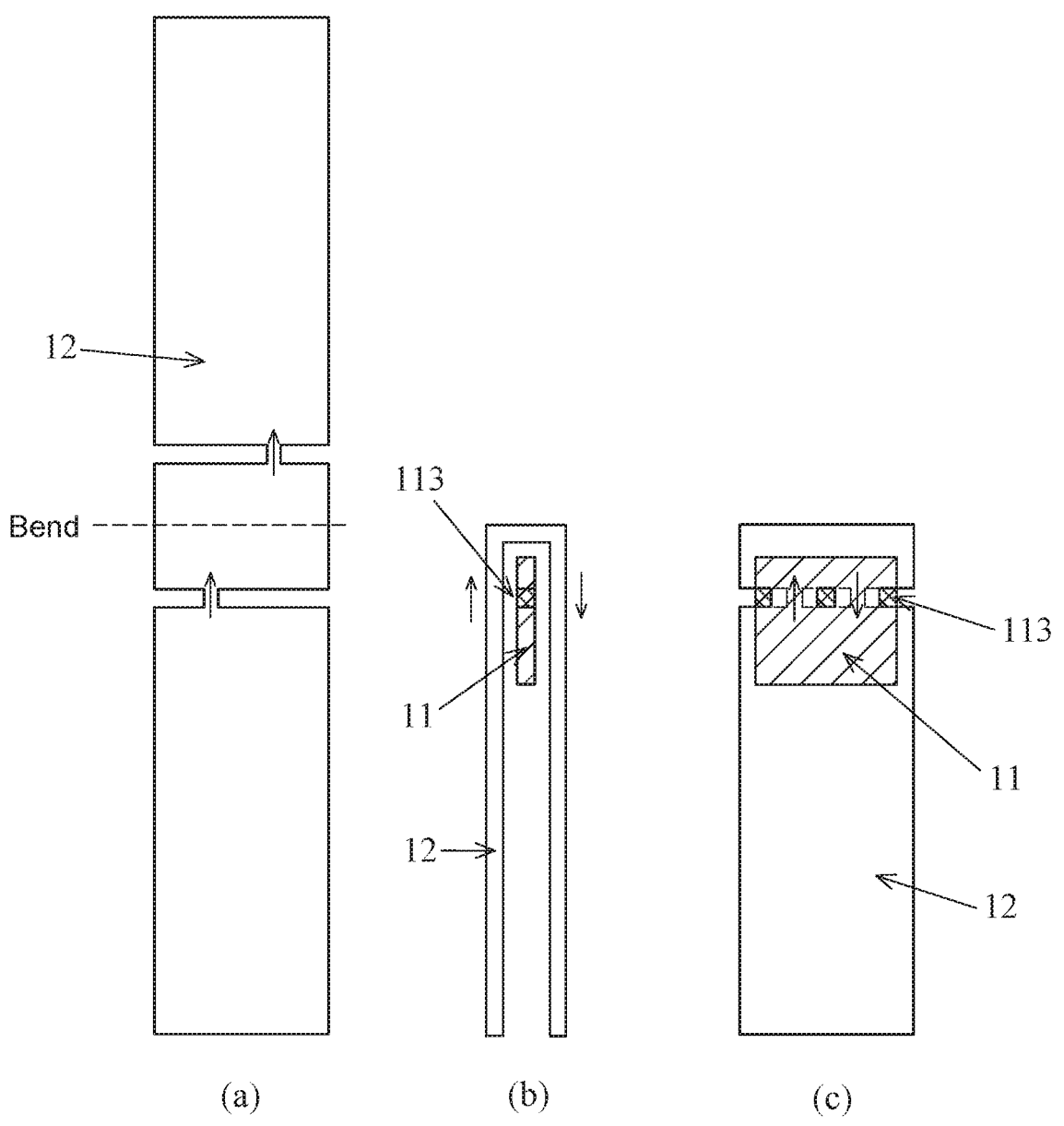
Figure 16A:
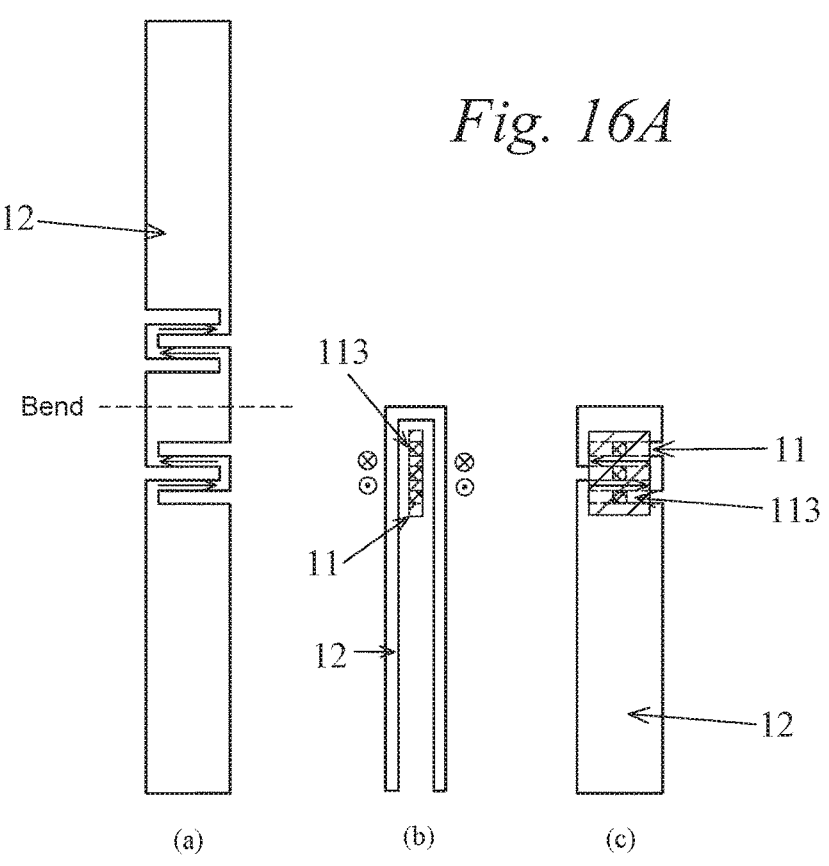
Figure 16B:
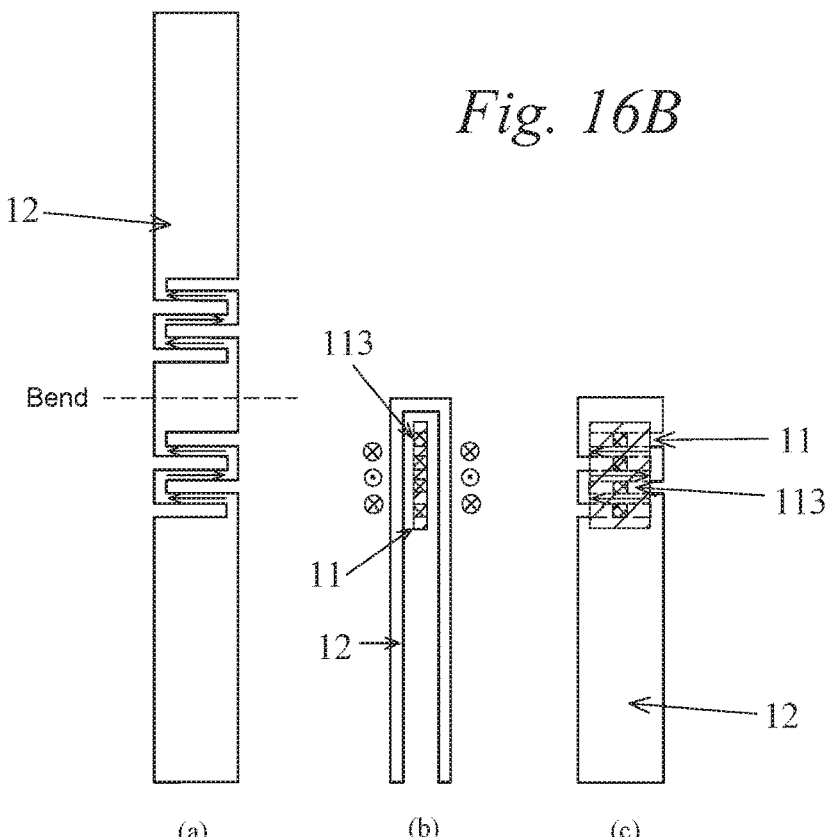
Figure 16C:
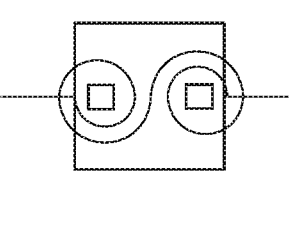
Figure 16C:
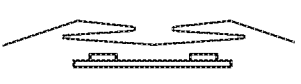
Figure 16C:
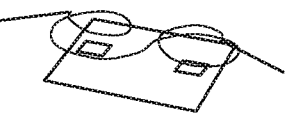
Figure 16C:
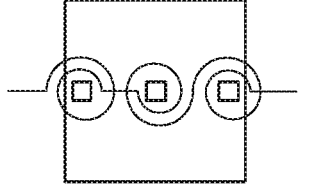
Figure 16C:
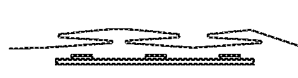
Figure 16C:
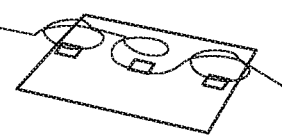
Figure 16C:
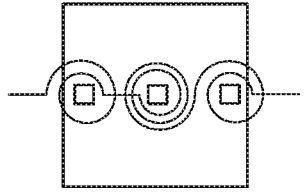
Figure 16C:
Figure 16C:
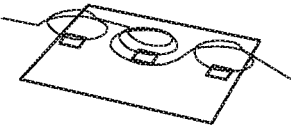
Figure 16C:
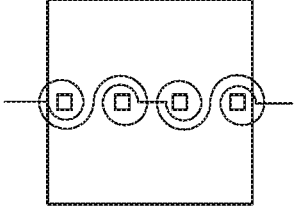
Figure 16C:
Figure 16C:
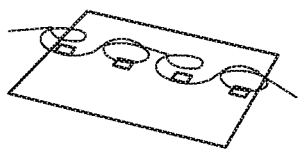
Figure 16C:
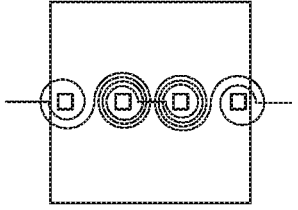
Figure 16C:
Figure 16C:
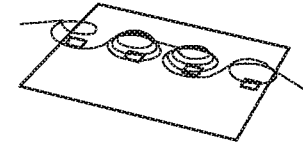
Figure 16C:
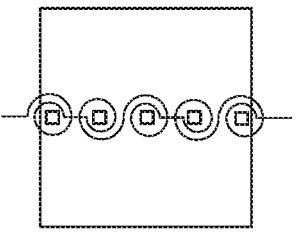
Figure 16C:
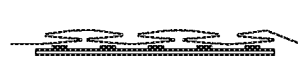
Figure 16C:
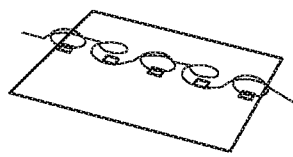
Figure 16C:
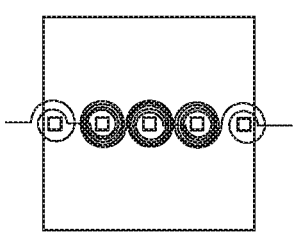
Figure 16C:
Figure 16C:
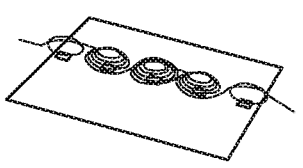
Figure 16D:
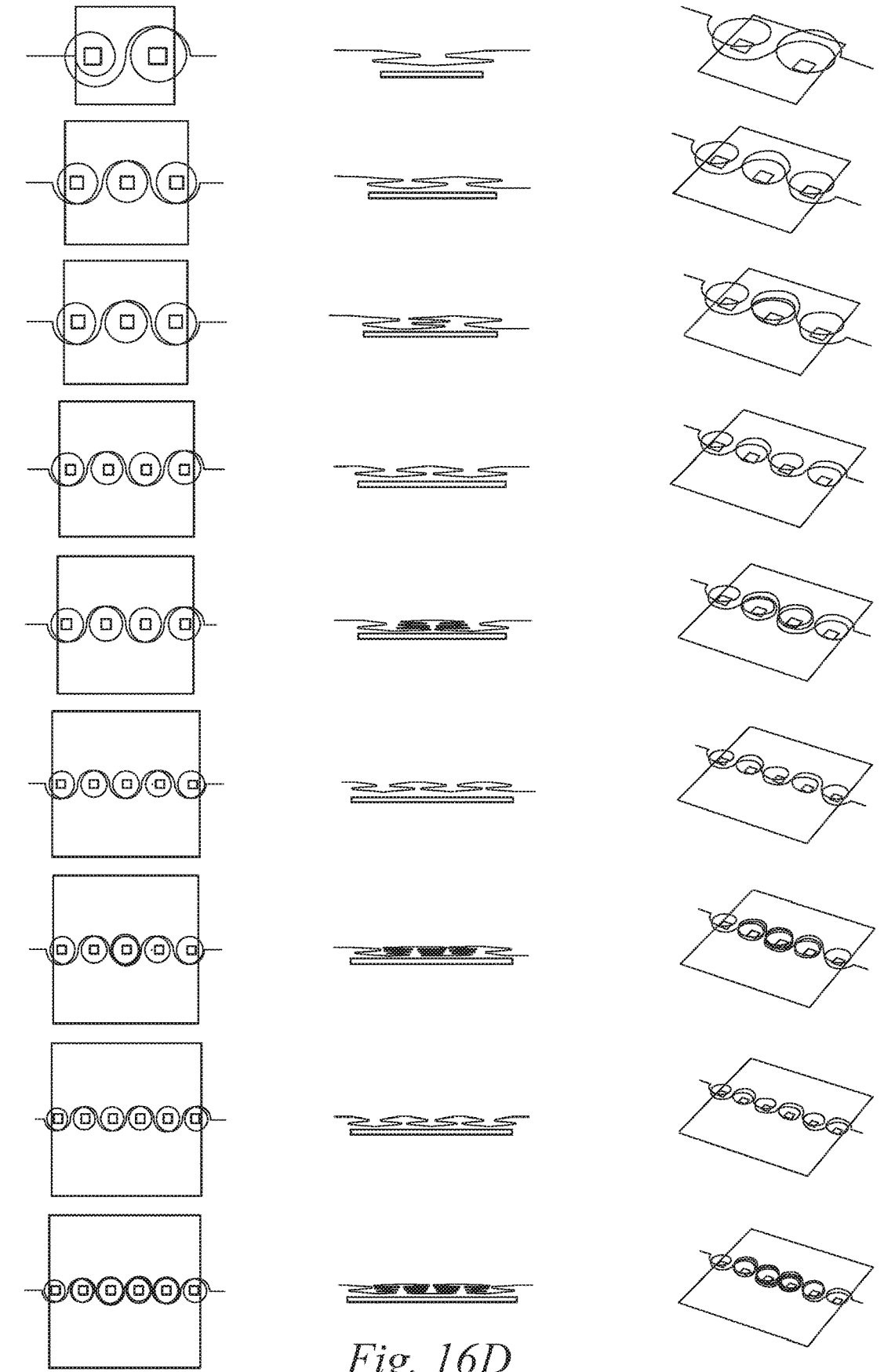

FIGS. 15 to 16D show non-limiting examples which can be implemented either with the current conductor 12 being an external shaped busbar, or by encapsulating the whole assembly, as an integrated system. FIG. 15 shows a non-limiting example arrangement containing n+1 collinear magnetic field sensors 113 and a conductor 12 appearing essentially as two (2) straight conductors orthogonal to the line of the sensors; in FIG. 15, n=2 and the conductors are shown as passing through the mid-points of the sensors, although neither condition is necessary, or necessarily optimal in practice. The optimal placement of the conductors depends on the spacing between the conductor 12 and the plane of the magnetic field sensors 113 and is easily determined. FIGS. 16A and 16B show a non-limiting example arrangement containing n+1 collinear magnetic field sensors 113 and a conductor 12 appearing essentially as 2m straight conductors orthogonal to the line of the sensors, for n=m=2 and n=m=3, respectively. FIGS. 16C and 16D show several non-limiting example arrangements containing n collinear magnetic field sensors 113 and a conductor 12 appearing essentially as a series of concentric circular windings with parallel axes which are orthogonal to the line of the sensors, arranged so as to generate a strong combined output signal of the sensors, for $2 \leq n \leq 6$.

Figure 17:
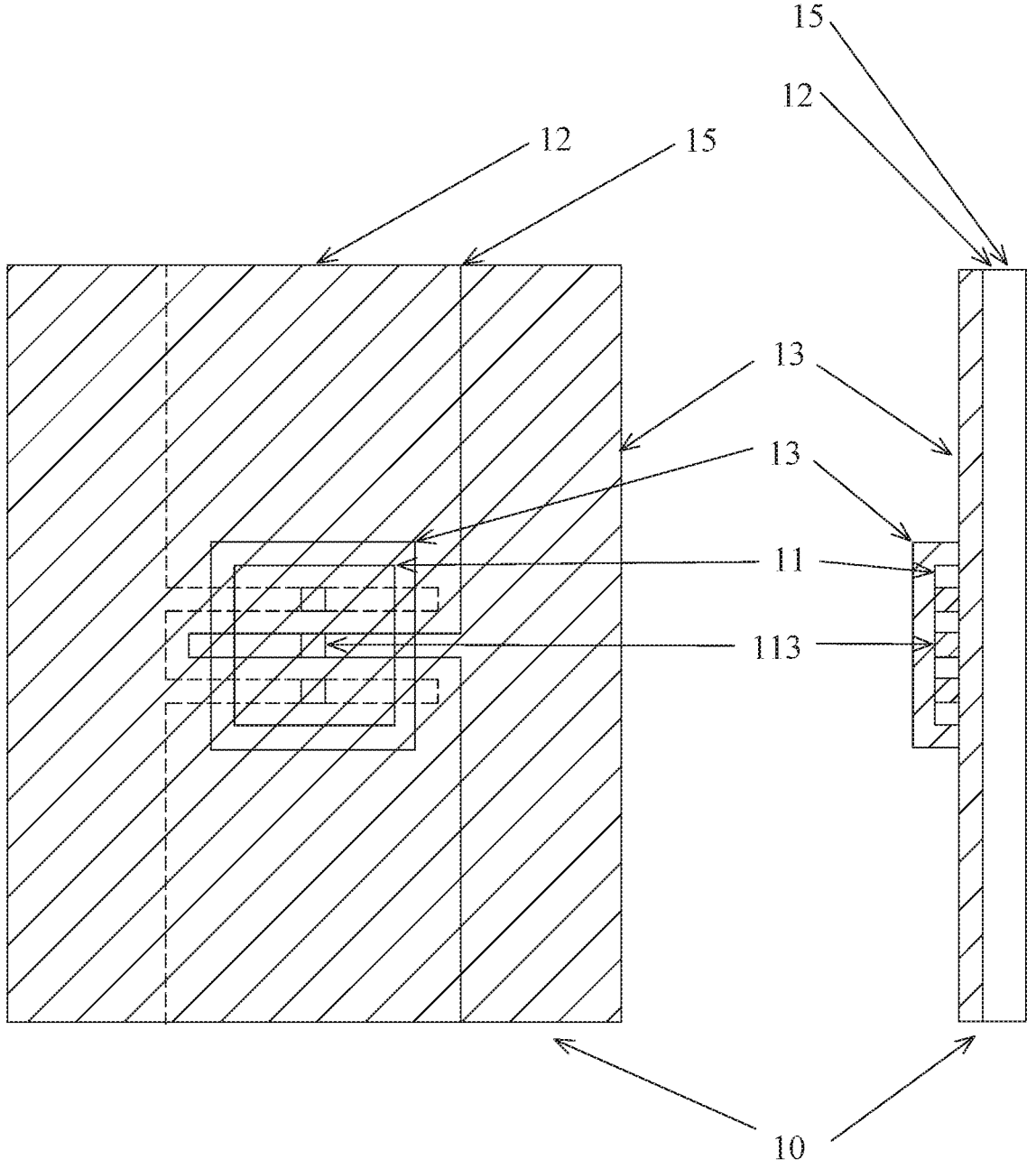

FIG. 17 shows a non-limiting example where the current conductor 12 is a shaped track on a printed circuit board (PCB), with the sensing sub-system 11 mounted on the PCB (as a non-limiting example, in a semiconductor package, as chip on board or as flip chip). FIG. 17 shows a non-limiting example arrangement containing n+1 collinear magnetic field sensors 113 and a conductor 12 appearing essentially as m straight conductors orthogonal to the line of the sensors, for n=m=2

Figure 18:
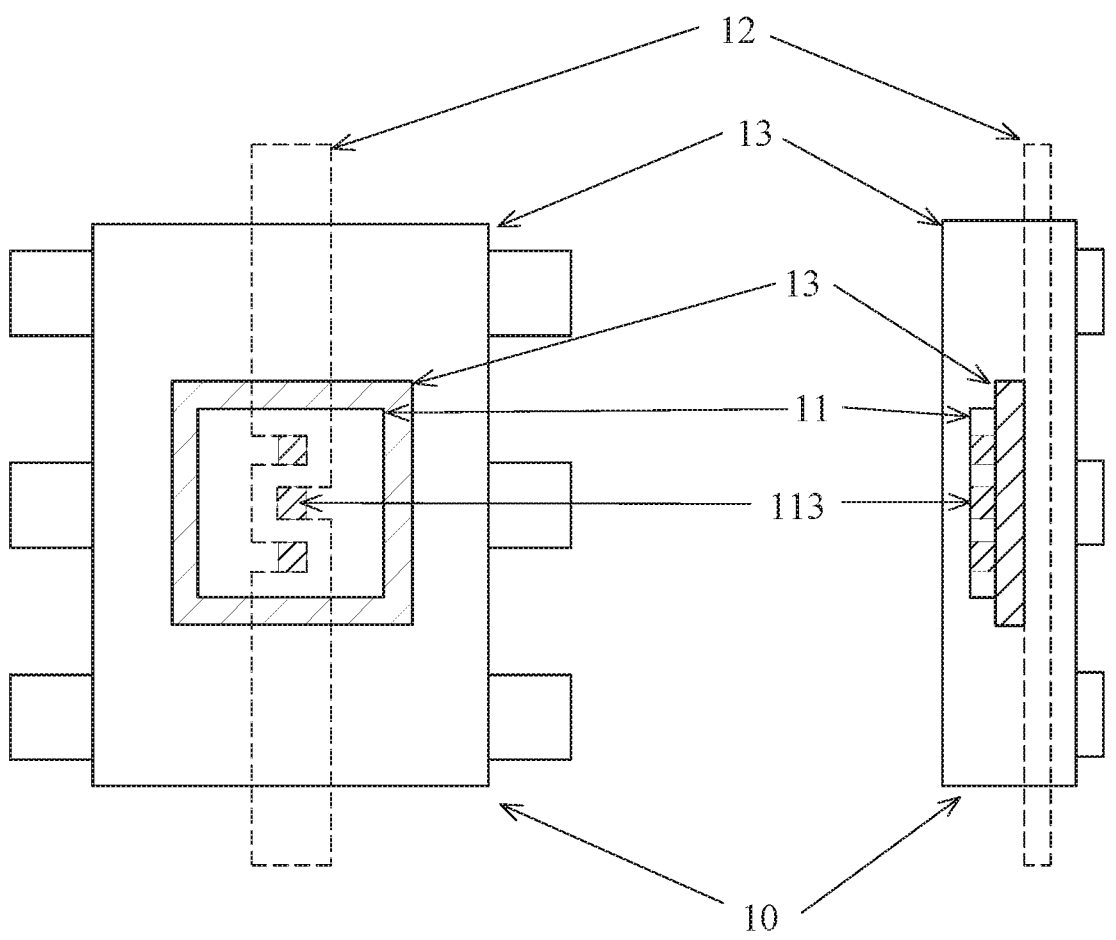

FIG. 18 shows a non-limiting example where the current conductor 12 is a shaped conductor forming an integral part of device 10. FIG. 18 shows a non-limiting example arrangement containing n+1 magnetic field sensors and a conductor appearing essentially as m straight conductors orthogonal to the line of the sensors, for n=m=2.

In FIGS. 16A, 16B, 17 and 18, we have n=m and the conductors are shown as passing at equidistant locations through the mid-points of the sensors, although neither condition is necessary, or necessarily optimal, in practice. The optimal value of m for a given n, and the optimal placement of the conductors depends on the spacing between the conductor 12 and the plane of the magnetic field sensors 113 and is easily determined.

Figure 1B:
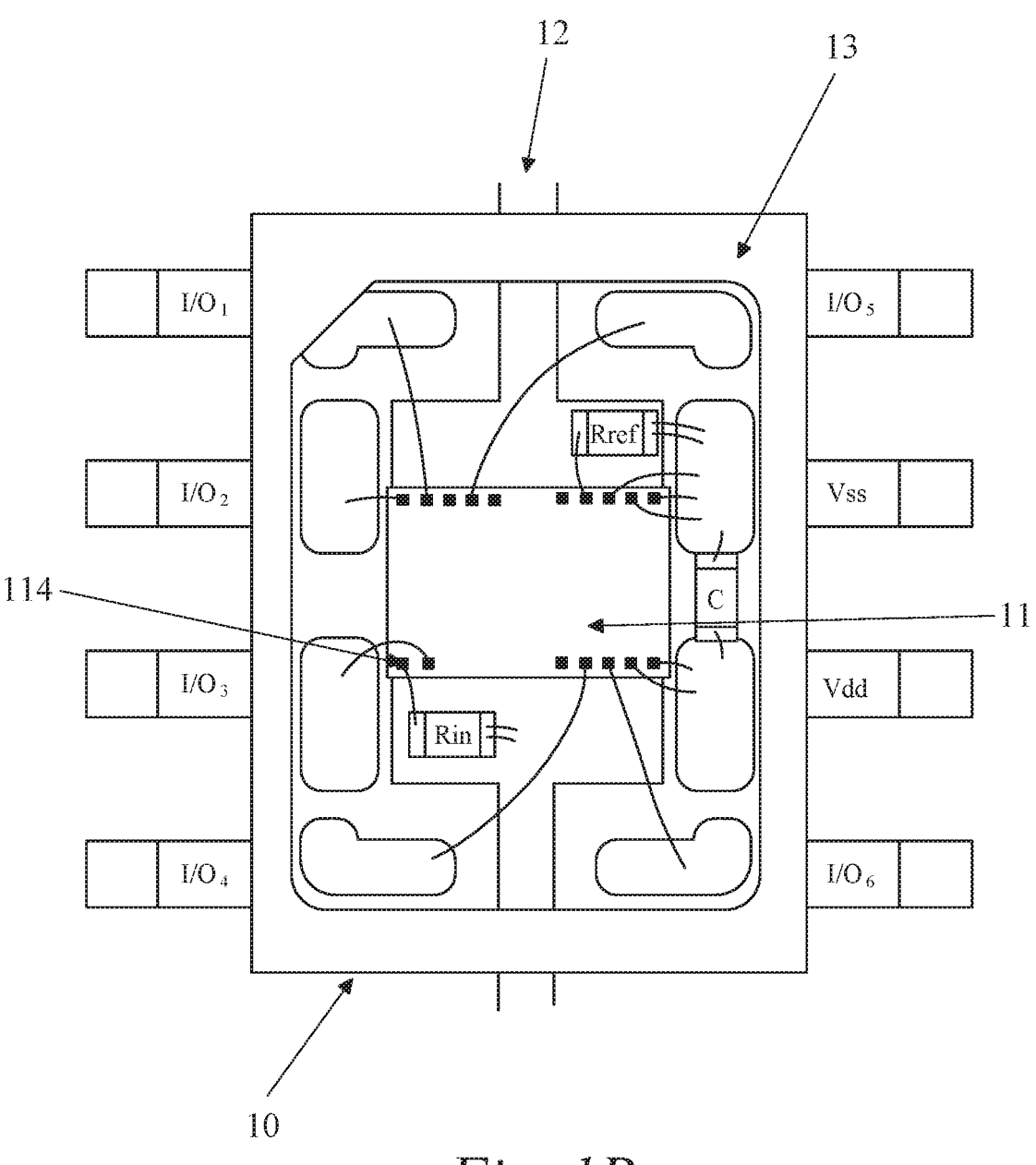
FIG. 1B shows a more detailed schematic view of selected components of the device in FIG. 1.

In the examples in FIGS. 1 to 1B. 6B to 6F and 7B to 7F, the sub-system 11 is a 4, 6, 8, 12 or 14-pin chip integrated in a standard integrated circuit package such as, by way of a non-limiting example, Small-Outline Integrated Circuit (SOIC). Small Outline Package (SOP), Shrink Small Outline Package (SSOP). Thin-Shrink Small Outline Package (TS-SOP), etc.

Each of the terminals $I/O_1$, $I/O_2$, $I/O_3$, $I/O_4$, $I/O_5$, $I/O_6, \ldots, I/O_n$ in the examples in FIGS. 1B, 2, 4, 5, 6 and 7 may in some examples be assigned to one of a number of combinations of input-output signals of the sub-system 11 (with $AOUT_i$, $PWMOUT_i$, $POUT_i$, $TOUT_i$, $CPOUT_i$, $CNOUT_i$. DIR, CREEP, SCLK, MOSI, MISO, SS, IRQ, COMM, SLEEP, PROG, SEL, and TSEL in FIGS. 4A, 6A and 7A as non-limiting examples).

The signals in the examples in FIGS. 1B, 2, 4 to 4E, 6 to 6F and 7 to 7F are as follows;

VSS: connected to the negative terminal of the power supply to the sub-system 11, which by way of a non-limiting example may also be connected to neutral;

VDD: connected to the positive terminal of the power supply to the sub-system 11 (by way of a non-limiting example only, this may be a 5V or a 3.3V DC supply);

IRQ: an optional digital output which detects the ends of AC voltage cycles, for example either upwards or downwards zero crossings of the AC voltage line; may also indicate that the reading on some of the other pins is available;

$AOUT_i$: an optional output or outputs (distinguished by the index/subscript i if there is more than one present) of an analog voltage signal, which in some examples may be related to the value of one of the quantities that the sub-system 11 measures (e.g, the total energy flow, the total reactive energy flow, the time integral of the rectified voltage, and the temperature, as non-limiting examples), at the end of the just-ended mains voltage period, for example in some examples it may be proportional to it; in other examples, it may be an affine function (i.e. proportional with an offset) of it; and in other examples it may be related to it in a different way;

$PWMOUT_i$: an optional pulse-width-modulated (PWM) output or outputs (distinguished by the index/subscript i if there is more than one present), with pulse width related to the value of some quantity that the sub-system 11 measures, where the relationship and the quantities may be as a non-limiting example be similar as in the case of pin $AOUT_i$;

PROG: an optional input/output which may be used during calibration and/or re-calibration to adjust parameters of the sub-system 11 (with gain and/or offset and/or temperature compensation and/or other parameters as non-limiting examples);

SLEEP: an optional input which may be used for a sleep input to a sleep function configured to, in a sleep mode of operation, partially or completely shut down the device. The sleep mode may allow low power operation in which the device may, as a non-limiting example, consume microwatts only of power. The device may be configured to operate in the sleep mode during a great proportion of the total operation of the device. e.g. as a non-limiting example, 90% of the total time of operation, whilst still providing accurate measurement;

DIR: an optional digital output indicating the current direction of energy flow (positive or negative);

CREEP: an optional digital output indicating that the power flow is below a certain predetermined fixed threshold (which may in some examples be configurable);

SS, SCLK, MOSI, MISO: optional digital input/output pins implementing the SPI interface;

SS: digital input pin; SPI interface slave select pin;

SCLK: digital input pin: SPI interface clock pin;

MOSI: digital input pin; SPI interface master output/ slave input pin;

MISO: digital output pin; SPI interface master input/ slave output pin;

By way of a non-limiting example only, this interface may be used to communicate the readings of at least some of the parameters the device 10 measures and/or determines, or to set certain of device 10's parameters.

COMM: an optional inter-device communication line, for communicating between several devices performing measurements in different phases in a poly-phase measurement setup. In a non-limiting example only, multiple devices measuring power in different phases may use this single communication line to totalize the power between phases. In a non-limiting example, every device may output a pulse of a very short duration (to reduce the error caused by pulse collisions sufficiently below the required threshold of accuracy) corresponding to quanta of energy flow, and every device may be monitoring the line and adding up all the pulses on the line to its own count of energy quanta.

VIN: a voltage sensing input pin which in a non-limiting example application may be connected to an AC voltage line via a resistor Rin, which as a non-limiting example may be a high resistance resistor. In a non-limiting example, the resistance of resistor Rin may be chosen so that an input current of a fixed amount flows into the VIN input pin at a rated AC voltage. In a non-limiting example, this current may be chosen somewhere in the range between 250 μA and 1 mA, or it may take a different value. Thus, as a non-limiting example, at a 250 μA current, Rin may be chosen to be 880kΩ for a 220V rated AC voltage, 440kΩ for a 110V rated AC voltage, 1.26MΩ for a 315V rated AC voltage, or another value for a different voltage.

$POUT_i$: an optional digital output or outputs (distinguished by the index/subscript i if there is more than one present) outputting pulses corresponding to quanta of the time-integral of one of the quantities Q (which may, by way of non-limiting examples only, be power, reactive power, or the integral of the rectified voltage) measured by device 10. In some non-limiting examples, the pulses may be substantially rectangular-shaped pulses. In some non-limiting examples, the pulses on at least one such output may be of fixed time duration and representing quanta of a single sign only. Alternatively or additionally, in some non-limiting examples, the pulses on at least one such output may be of one of two possible fixed time durations, one duration corresponding to positive quanta and another fixed time duration corresponding to negative quanta. In some non-limiting examples, the fixed quantum and the pulse duration may be chosen so that at the maximum possible specified value of quantity Q, the duty cycle of this output is less than 100%. In some non-limiting examples only, quantity Q may be the product of a magnetic field and a current (measured in units of TAs) which is proportional to a (by way of non-limiting examples, active or reactive) instantaneous power. Alternatively or additionally, in some non-limiting examples, several outputs $POUT_1$, . . . , $POUT_n$, may be configured, with some of these outputs outputting pulses corresponding to quanta of quantity Q only when a specific tariff is selected. Alternatively or additionally, in some non-limiting examples, the device may be configurable to choose between several different possible values of the quantum and pulse duration: in a non-limiting example, this may be to permit a faster mode to use when the device is being calibrated, to permit for faster calibration, or for the measurement of instant power, and a slower mode, for example to be used for energy measurement. By way of non-limiting examples only, for a configuration of device 10 configured to work for maximum magnetic fields of $B_{max}$ (which by way of a non-limiting example may be between 2 mT and 20 mT) and maximum VIN current of $I_{max}$ (which by way of a non-limiting example may be between 300 μA and 1 mA), the quantum (q) and pulse duration (t) can be chosen in any way that satisfies $t \leq q/(B_{max} \cdot I_{max})$. By way of non-limiting examples, the pulse duration may be chosen in the range 5 μs-30 ms; and the quantum in the range 300 pTAs-4μTAs. Clearly, these are meant to be non-limiting examples and entirely different values may be appropriate depending on the application;

$CPOUT_i$, $CNOUT_i$: an optional digital output or outputs (distinguished by the index/subscript i if there is more than one present) outputting shaped pulses corresponding to quanta of the time-integral of a product of a magnetic field and a current (measured in units of TAs) which are proportional to a (by way of non-limiting examples, active or reactive) energy flow. Alternatively or additionally, by way of a non-limiting example, the pulses these outputs produce may be of fixed duration (which may, by way of a non-limiting example only, be 200 ms). Alternatively or additionally, by way of a non-limiting example, these outputs may come in pairs $CPOUT_i$, and $CNOUT_i$, where the second output of the pair outputs a pulse immediately after the output of the first output of the pair, has stopped outputting a pulse, and at no other time. Alternatively or additionally, by way of a non-limiting example, the voltage levels and pulse shaping and duration on these outputs may be chosen so as to be able to drive a mechanical display directly, and the quantum may be chosen so as to output one pulse per 0.1 kWh or another quantity which provides the correct output for the mechanical display. In some non-limiting examples, a first pair of outputs $CPOUT_i$ and $CNOUT_i$ may output pulses corresponding to positive quanta of energy flow, and a second pair of outputs $CPOUT_i$ and $CNOUT_i$ may output pulses corresponding to negative quanta of energy flow. Alternatively or additionally, in some non-limiting examples, some pairs of outputs $CPOUT_i$ and $CNOUT_i$ may output pulses only when a particular tariff is selected.

$TOUT_i$: an optional digital output or outputs (distinguished by the index/subscript i if there is more than one present) outputting high-to-low and low-to-high transitions corresponding to quanta of the time-integral of one of the quantities H (which may in some non-limiting examples be power, reactive power, or the integral of the rectified voltage) measured by device 10. In some non-limiting examples, quantity H may be unsigned and may be represented by one such output representing quanta of a single sign only of quantity H. Alternatively or additionally, in some non-limiting examples, quantity H may be signed and may be represented by two such outputs, the first output representing positive quanta, and the second output representing negative quanta.

RREF: a reference current input pin present on some embodiments or examples of the present disclosure, which in a non-limiting example application is connected to VSS line via a resistor Rref which in a non-limiting example may be of fixed resistance known with a relatively high degree of accuracy. Some embodiments or examples of the present disclosure do not require this pin.

SEL: an input selecting one of various functions of the device 10.

TSEL: an input selecting one of at least two tariffs and/or selecting between unidirectional or bidirectional metering.

In the examples in FIGS. 4B, 6B and 78, the output POUT may in some non-limiting examples be configured to output power. Alternatively or additionally, the output TOUT may in some non-limiting examples be configured to output the integral of the rectified voltage.

In the examples in FIGS. 4C, 6C and 7C, the input TSEL may in some non-limiting examples be configured to have three settings (e.g. high, low and tri-state) with one state selecting tariff 1, a second state selecting tariff 2, and a third setting selecting bidirectional measurement.

Alternatively or additionally, in some non-limiting examples, the outputs $POUT_1$, $POUT_2$, $CPOUT_1$, $CNOUT_i$, $CPOUT_2$ and $CNOUT_2$ may be configured to output power, with $POUT_i$, $CPOUT_1$ and $CNOUT_1$ outputting either positive power flow or tariff 1 power flow and $POUT_2$, $CPOUT_2$ and $CNOUT_2$ outputting either negative power flow or tariff 2 power flow.

In the examples in FIGS. 6D and 7D, the outputs POUT, CPOUT and CNOUT may in some non-limiting examples be configured to output positive power flow.

In the examples in FIGS. 4D, 6E and 7E, the outputs $AOUT_1$ and $AOUT_2$ may in some non-limiting examples be configured to output two out of the following four quantities: active power, reactive power, temperature, integral of the rectified voltage.

In the examples in FIGS. 4E, 6F and 7F, the outputs $POUT_1$ and $POUT_2$ may in some non-limiting examples be configured to output positive and negative energy flow, respectively. A further possible example of the device in FIG. 7 is a 3-pin device, comprising pins VSS. VDD and I/O, where I/O may in some non-limiting example bes a POUT or a PWMOUT type output, outputting energy, thus providing an integrated plug and play 3-pin energy sensor. With a PWMOUT type output, both energy and line frequency can be measured (the latter in some non-limiting examples being provided by rising edge transitions of the PWM output).

It is understood that, in the context of the present disclosure and with reference to FIG. 12, the device 10 may be incorporated and/or connected to any system 1000, in particular, as a non-limiting examples, an electrical system 1000 configured to be connected to an AC electricity supply 101.

In some examples, the electrical conductor 12 is connected to the AC electricity supply, so that the electrical system 1000 is configured as a system measuring its own power consumption.

In some examples, the system 1000 further comprises a communication module 102 configured to communicate with at least one external device 103 and/or with at least one other electrical System, for example another system 1000, in order to form a network 1003 of inter-connected devices (and/or form a part of the Internet-Of-Things (IoT), as a non-limiting example). In some examples, the communication module 102 may be at least partly integrated in the device 10.

In some examples, the system 1000 further comprises a temperature sensor 123. In some examples, the temperature sensor 123 may be at least partly integrated in the device 10.

In some examples, the communication module 102 is configured to communicate the value of at least one of the parameters provided by the input-output signals of the device 10, the temperature sensor 123 or values that may be derived from any combination of them.

In some examples, the communication module 102 is configured to operate according to a wireless communication protocol (such as Wi-Fi, Bluetooth or mobile telephony, as non-limiting examples) and/or a wired communications protocol (such as a power-line communication protocol or Ethernet as non-limiting examples).

The system 1000 may comprise at least one of any one of:

an electrical socket connected to the mains; or,
an electrical plug configured to be connected to the mains via an electrical socket; or,
an electrical adapter configured to be connected to the mains via an electrical socket and/or electrical plug; or.
a light bulb; or,
an electrical meter; or,
a domestic appliance;
a circuit breaker; or,
any other electrically powered device; or,
any combination of the foregoing.

FIGS. 9A to 9F and 11A to 11F illustrate examples of electromechanical meters according to the present disclosure, incorporating example power measurement devices according to the present disclosure, or example parts of power measurement devices according to the present disclosure, which may or may not be encapsulated in integrated circuit packages. In all examples in these figures, the part or device used comprises driving circuitry required to generate output pulses to drive a mechanical display 16 without any external circuitry.

Each part 11 in FIGS. 9A to 9F may comprise the part in FIG. 4C used in die form and may, by way of a non-limiting example, be directly bonded to a PCB (by way of non-limiting examples, as chip-on-board (COB) or flip chip) or may alternatively comprise the part in FIG. 6C which is the part in FIG. 4C encapsulated in a 14-pin package. Alternatively, if it is an 8-pin part, it may alternatively comprise the part in FIG. 6D, which is the Part in FIG. 4C encapsulated in an 8-pin package.

Each device 10 in FIGS. 11A to 11F may comprise the device in FIG. 7C which is the part in FIG. 4C encapsulated in a 12-pin package with an integrated conductor. Alternatively, if it is an 6-pin device, it may alternatively comprise the part in FIG. 7D, which is the part in FIG. 4C encapsulated in a 6-pin package with an integrated conductor.

In the examples in FIGS. 9A to 9F, the electromechanical meter comprises (with n=1 in FIGS. 9A to 9C and n=3 in FIGS. 9D to 9F; with m=1 in FIGS. 9A and 9D and m=2 in FIGS. 9B, 9C, 9E and 9F);

a meter enclosure, a single sided PCB, containing;

n×part 11 in FIG. 4C, either attached as flip chip or COB or integrated in a package as the part in FIG. 6C or the part in FIG. 6D n×resistor Rin n×resistor Rref, n×decoupling capacitor C, n×Voltage Dependent Resistor (VDR)

m×cyclometer mechanical display 16, an unregulated 5V DC power supply,

LEDs as in each diagram, n×copper busbar 12, which in some examples may be 50 mm×15 mm×1 mm, shaped, n×plastic insulating foil, 2n+2 mounting screws.

In the examples in FIGS. 11A to 11F, the electromechanical meter comprises (with n=1 in FIGS. 11A to 11C and n=3 in FIGS. 11D to 11F: with m=1 in FIGS. 11A and 11D and m=2 in FIGS. 11B, 11C, 11E and 11F);

a meter enclosure, a single sided PCB, containing;

n× device 10 in FIG. 7C or the device in FIG. 7D n× Voltage Dependent Resistor (VDR), m×cyclometer mechanical display 16, an unregulated 5V DC power supply, LEDs as in each diagram, 2n+2 mounting screws.

FIGS. 9A and 11A show examples of a complete unidirectional meter, which may include an LED pulse output.

FIGS. 9B and 11B show examples of a complete bidirectional single phase meter, which may include two LED pulse outputs, an energy flow direction indication LED and an LED indicating energy flow being below a certain fixed threshold ("meter stopped" indicator).

FIGS. 9C and 11C show examples of a complete unidirectional single phase dual tariff meter, which may include an LED pulse output and an indication of energy flow being below a certain fixed threshold ("meter stopped" indicator), and an energy flow direction indication LED (which may for example be used to detect that the meter is incorrectly connected).

FIGS. 9D to 9F, and 11D to 11F show examples of polyphase meters connected to polyphase mains (three phases in the examples in these figures), featuring one device 10 per phase, in which each of the devices 10 comprises a single inter-chip communication line, and a module configured to aggregate the readings provided by the individual devices 10. FIGS. 9D and 11D show examples of complete 3-phase unidirectional meters. FIGS. 9E and 11E show examples of complete 3-phase bidirectional meters. FIGS. 9F and 11F show examples of complete 3-phase unidirectional dual tariff meters.

By way of a non-limiting example, the energy measurement device according to the present disclosure may in some examples work on a single 5V DC unregulated power supply and achieve the accuracy of +0.5% of reading over a 1:500 dynamic range of power (over the full range of current, voltage and power factor between at least 0.5 and 1 in absolute value, and frequency range between 40 Hz and 5 kHz), with a temperature coefficient of 100 ppm/° C., over a-40° C. . . . +85° C. range, and may meet or exceed the requirements for IEC 62053 Class 0.5S and ANSI C12.20

Class 0.5 meters, exceeding all specifications for rejecting stray electromagnetic fields, without shielding, by a substantial factor. By way of a non-limiting example, the energy measurement device according to the present disclosure may in some examples consume at most 50µW of power in sleep mode and approximately 30 mW of power in awake mode.

With reference to the drawings in general, it will be appreciated that schematic functional block diagrams are used to indicate functionality of devices, systems, modules and circuitry described herein. It will be appreciated however that the functionality need not be divided in this way, and should not be taken to imply any particular structure of hardware other than that described and claimed below. The function of one or more of the elements shown in the drawings may be further subdivided, and/or distributed throughout devices, systems, modules and circuitry of the disclosure. In some embodiments, aspects or examples, the function of one or more elements shown in the drawings may be integrated into a single functional unit.

The above embodiments and examples are to be understood as illustrative examples. Further embodiments, aspects or examples are envisaged. It is to be understood that any feature described in relation to any one embodiment, aspect or example may be used alone, or in combination with other features described, and may also be used in combination with one or more features of any other of the embodiments, aspects or examples, or any combination of any other of the embodiments, aspects or examples. Furthermore, equivalents and modifications not described above may also be employed without departing from the scope of the invention, which is defined in the accompanying claims.

In the context of the present disclosure, the term device may refer to a part only of the device.

Below are some additional optional features.

In the context of the present disclosure, an integrated device may be configured to simultaneously measure more than one quantity by way of mode switching.

In the context of the present disclosure, an integrated device may be configured to measure rectified instantaneous current as a measured quantity.

In the context of the present disclosure, an integrated device may be configured to derive a measure of the root-means-squared. RMS, current of the current input. In the context of the present disclosure, the measure of the RMS current may be derived from the integral of the rectified current.

As already stated, an apparatus of the present disclosure may comprise a circuit breaker.

In some examples, the apparatus and/or the circuit breaker may further comprise means for switching off the mains current. In some examples, the means of switching off the mains current may comprise at least one of;

a mechanically operated switch, such as a mechanical switch and/or an electromagnetic switch; and/or a semiconductor switch configured to perform the switching, such as a solid state switch.

In some examples, the apparatus and/or the circuit breaker may comprise a mechanically operated switch which is electronically controlled.

In some examples, the apparatus and/or the circuit breaker may comprise a mechanically operated switch which comprises a relay.

In some examples, the apparatus and/or the circuit breaker may comprise a semiconductor switch which comprises a three-electrode semiconductor device, such as a triac.

In some examples, the apparatus and/or the circuit breaker may be configured to fit inside a standard plug and/or socket, or a plug and/or socket of substantially the same form factor as a standard plug and/or socket.

In some examples, the apparatus and/or the circuit breaker may be of the same form factor, or of substantially the same form factor, as a standard fuse.

In some examples, a plug or a socket may contain an apparatus according to any aspect of the present disclosure.

In the present disclosure, any feature of any one of a device and/or system and/or apparatus and/or meter and/or method and/or processor and/or computer program product may be combined with any feature or combination of features of any one of a device and/or system and/or apparatus and/or meter and/or method and/or processor and/or computer program product according to the disclosure.

In some examples, one or more memory elements can store data and/or program instructions used to implement the operations described herein. Embodiments, aspects or examples of the disclosure provide tangible, non-transitory storage media comprising program instructions operable to program a processor to perform any one or more of the methods described and/or claimed herein and/or to provide data processing apparatus as described and/or claimed herein.

The activities and apparatus outlined herein may be implemented with fixed logic such as assemblies of logic gates or programmable logic such as software and/or computer program instructions executed by a processor. Other kinds of programmable logic include programmable processors, programmable digital logic (e.g., a field programmable gate array (FPGA), an erasable programmable read only memory (EPROM), an electrically erasable programmable read only memory (EEPROM)), an application specific integrated circuit, ASIC, or any other kind of digital logic, software, code, electronic instructions, flash memory, optical disks, CD-ROMs. DVD ROMs, magnetic or optical cards, other types of machine-readable mediums suitable for storing electronic instructions, or any suitable combination thereof.

Numerical References Index

10—device
11—measurement sub-system
12—electrical conductor
13—insulating material encapsulating measurement sub-system
15—printed circuit board
16—cyclometer display
101—AC electricity supply
102—communication module
103—external device
111—signal processor
112—magnetic field sensing circuitry
113—magnetic field sensing element
114—voltage sensing input
115—input-output circuitry
116—integration circuitry
117—calibration circuitry
118—temperature compensation module
119—zero-crossing detection module
120—sleep function circuitry
123—temperature sensor
124—combination module
1000—system integrating the device
1003—network of inter-connected devices

What is claimed is:

1. An integrated device comprising:
at least one electrical conductor to conduct a current; and
at least one sensing circuitry arranged to be placed in proximity to the at least one electrical conductor, the at least one sensing circuitry comprising at least one magnetic field sensing element, and the at least one sensing circuitry configured to measure at least one quantity dependent on the current as a combination of outputs of the at least one magnetic field sensing element caused by the current flowing through the at least one electrical conductor,
wherein the integrated device is configured to provide an output measure of power, energy, or reactive power through the at least one electrical conductor,
wherein the integrated device is encapsulated in an integrated circuit package.

2. The integrated device of claim 1, further comprising an input for sensing a measure of a voltage.

3. The integrated device of claim 2, wherein the at least one magnetic field sensing element is arranged to be biased by a current derived from and/or related to the current into or out of the input, such that the output from the at least one magnetic field sensing element is related to the current through the electrical conductor and the current into or out of the input.

4. The integrated device of claim 1, wherein the at least one magnetic field sensing element comprises at least one Hall element.

5. The integrated device of claim 1, wherein the combination of outputs is a linear combination.

6. The integrated device of claim 1, wherein the at least one sensing circuitry is configured to at least partially reject stray magnetic fields.

7. The integrated device of claim 1, wherein the device is configured to simultaneously measure more than one quantity by one or more of:
mode switching,
time-mutiplexing, and
incorporating more than one set of the at least one magnetic field sensing element.

8. The integrated device of claim 1, wherein the device is configured to have one or more of:
an offset compensation functionality,
a temperature dependence compensation functionality, and
a sleep function configured to, in a sleep mode of operation, at least partially shut down the device.

9. The integrated device of claim 1, further comprising:
a zero-crossing detection module to provide a measure of 0-transitions of the input.

10. The integrated device of claim 1, wherein the pins are electrically insulated from the at least one electrical conductor.

11. A method of manufacturing an integrated device, the method comprising:
manufacturing the integrated device of claim 1;
wherein the manufacturing further comprises fully calibrating the integrated device such that the integrated device requires no further calibration by a user of the integrated device.

12. A method of manufacturing the integrated device of claim 1, the method comprising:
encapsulating a semi-conductor substrate in an integrated circuit package; and
bonding a wire to the encapsulation of the integrated circuit package.

13. The integrated device of claim 1, wherein the integrated circuit package has between 3 and 8 pins, and at least one of:

wherein the at least one electrical conductor is bonded to the integrated circuit package, and wherein the at least one electrical conductor is encapsulated in the integrated circuit package.

14. An integrated device comprising:

at least one electrical conductor to conduct a current, at least one sensing circuitry arranged to be placed in proximity to the at least one electrical conductor, the at least one sensing circuitry comprising at least one magnetic field sensing element, the at least one magnetic field sensing element arranged to be biased by a current derived from and/or related to the current into or out of an input, such that the output from the at least one magnetic field sensing element is related to the current through the electrical conductor and the current into or out of the input, wherein the integrated device is configured to provide an output measure of power, energy, or reactive power through the at least one electrical conductor, wherein the integrated device is encapsulated in an integrated circuit package having between 3 and 8 pins, and at least one of:

wherein the at least one electrical conductor is bonded to the integrated circuit package, and wherein the at least one electrical conductor is encapsulated in the integrated circuit package.

15. The integrated device of claim 14, further comprising:

integration circuitry configured to integrate the output measure over at least a major fraction of a complete AC cycle period of the input.

16. The integrated device of claim 14, further comprising:

a zero-crossing detection module to provide a measure of zero-transitions of the input.

17. A method of manufacturing an integrated device, the method comprising:

manufacturing the integrated device of claim 14;

wherein the manufacturing further comprises fully calibrating the integrated device such that the integrated device requires no further calibration by a user of the integrated device.

18. A device comprising:

one or more elements configured to interrupt an electrical current based on (i) maximum power flow, and (ii) a response time, wherein the response time is within one mains period or slower.

19. The device of claim 18, wherein the device is a circuit breaker.

20. A device configured to provide a measure of power, energy, or reactive power, wherein the device is configured to fit inside either:

at least one of: a standard-sized plug, and a standard-sized socket, or at least one of: a plug having a substantially similar form factor as a standard-sized plug, and a socket having a substantially similar form factor as a standard-sized socket.

21. The device of claim 20, wherein the device further comprises:

at least one sensing circuitry arranged to be placed in proximity to at least one electrical conductor, the at least one sensing circuitry comprising at least one magnetic field sensing element, and the at least one sensing circuitry configured to measure at least one quantity dependent on current as a combination of outputs of the at least one magnetic field sensing element caused by the current flowing through the at least one electrical conductor.

\* \* \* \* \*